(12) United States Patent
Kwon

(10) Patent No.: US 10,599,562 B2
(45) Date of Patent: Mar. 24, 2020

(54) NONVOLATILE MEMORY DEVICE CONFIGURED TO BE ACCESSED WITHOUT BLOCK ADDRESS AND METHOD OF OPERATING THE SAME

(71) Applicant: SAMSUNG ELECTRONICS CO., LTD., Suwon-si, Gyeonggi-do (KR)

(72) Inventor: Ohchul Kwon, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 15/984,445

(22) Filed: May 21, 2018

(65) Prior Publication Data
US 2019/0129837 A1    May 2, 2019

(30) Foreign Application Priority Data

Oct. 27, 2017    (KR) .................. 10-2017-0141245

(51) Int. Cl.
| | | |
|---|---|---|
| G06F 12/02 | (2006.01) | |
| G06F 11/10 | (2006.01) | |
| G11C 11/56 | (2006.01) | |
| G06F 3/06 | (2006.01) | |
| G11C 16/08 | (2006.01) | |
| G11C 16/04 | (2006.01) | |

(52) U.S. Cl.
CPC ........ G06F 12/0246 (2013.01); G06F 3/0632 (2013.01); G06F 3/0679 (2013.01); G06F 11/1068 (2013.01); G11C 11/5628 (2013.01); G11C 11/5642 (2013.01); G11C 16/08 (2013.01); *G06F 2212/2022* (2013.01); *G11C 16/0483* (2013.01)

(58) Field of Classification Search
CPC ............ G11C 11/5628; G11C 11/5642; G11C 16/0483; G11C 16/08; G06F 12/0246; G06F 3/0679; G06F 11/1068; G06F 3/0632; G06F 2212/2022
See application file for complete search history.

(56) References Cited

U.S. PATENT DOCUMENTS

| | | |
|---|---|---|
| 7,376,024 B2 | 5/2008 | Roohparvar |
| 7,436,705 B2 | 10/2008 | Roohparvar |
| 8,291,194 B2 | 10/2012 | Tsai et al. |
| 9,053,015 B2 | 6/2015 | Vasilyuk |
| 9,128,822 B2 | 9/2015 | Michael et al. |
| 9,329,850 B2 | 5/2016 | Gschwind et al. |
| 9,411,521 B2 | 8/2016 | Lu et al. |
| 9,471,420 B2 | 10/2016 | Yoon et al. |
| 2011/0041039 A1* | 2/2011 | Harari ................ G06F 11/1068 714/773 |
| 2011/0161784 A1* | 6/2011 | Selinger ............. G06F 11/1068 714/768 |

(Continued)

*Primary Examiner* — Gene N Auduong
(74) *Attorney, Agent, or Firm* — Volentine, Whitt & Francos, PLLC

(57) ABSTRACT

A nonvolatile memory device includes multiple memory blocks. A first memory block stores first data. A reference memory block stores an indicator indicating the first memory block as an indication in response to a first direct access command received from the outside. A first physical area of the first memory block is accessed according to a page address received from the outside together with the first direct access command, and the indication of the indicator.

20 Claims, 17 Drawing Sheets

(56) References Cited

U.S. PATENT DOCUMENTS

| | | | |
|---|---|---|---|
| 2014/0258588 A1* | 9/2014 | Tomlin | G06F 12/0246 |
| | | | 711/103 |
| 2015/0089124 A1* | 3/2015 | Chu | G06F 12/1408 |
| | | | 711/103 |
| 2018/0024738 A1* | 1/2018 | Ngu | G06F 3/061 |
| | | | 711/103 |

* cited by examiner

NONVOLATILE MEMORY DEVICE CONFIGURED TO BE ACCESSED WITHOUT BLOCK ADDRESS AND METHOD OF OPERATING THE SAME

CROSS-REFERENCE TO RELATED APPLICATIONS

This U.S. non-provisional patent application claims the benefit of priority under 35 U.S.C. § 119 to Korean Patent Application No. 10-2017-0141245, filed on Oct. 27, 2017 in the Korean Intellectual Property Office, the disclosures of which are incorporated by reference herein in their entireties.

BACKGROUND

1. Technical Field

The present disclosure relates to a semiconductor device. More particularly, the present disclosure relates to a memory device configured to be accessed without a block address.

2. Description of the Related Art

A semiconductor memory device is generally classified as a volatile memory device or a nonvolatile memory device. Read and write speeds of the volatile memory device are fast, but data stored therein disappear when power supply is discontinued. In contrast, the nonvolatile memory device retains data stored therein even though external power supply is discontinued. Therefore, the nonvolatile memory device is used to store information to be retained regardless of whether power is supplied. An example of the nonvolatile memory device is a flash memory that is used in portable electronic devices.

A nonvolatile memory device such as a flash memory may store firmware needed to drive or manage a storage device including the nonvolatile memory device. The firmware may be loaded onto a buffer memory such as a DRAM (dynamic random-access memory) as a boot code or separate firmware stored in a ROM (read only memory) of a controller to control the flash memory is executed. An addressing rule is needed for accessing a physical area where firmware is stored, upon loading the firmware from the nonvolatile memory device.

However, when manufacturers of the nonvolatile memory device and the controller that controls the nonvolatile memory device are different from each other, a problem may arise with regard to the addressing rule for loading the firmware. For example, an address of a memory block which stores firmware may vary for each manufacturer of nonvolatile memory devices. In this case, an area (i.e., an address of a memory block) where firmware is stored may be obtained by reading and parsing a separate ID supported by a nonvolatile memory device. However, it is difficult to satisfy addressing rules that vary for different manufacturers. In the case where the addressing rule changes with a manufacturer, performance and lifespan of products may be reduced. Accordingly, solutions such as those described herein are increasingly important.

SUMMARY

Embodiments of the present disclosure are directed to mechanisms for handling addressing rules that vary for different memory vendors by implementing a memory device so as to be accessed without a block address.

According to an exemplary embodiment, a nonvolatile memory device includes multiple memory blocks, including a first memory block and a reference memory block. The first memory block includes a first physical area which stores first data. The reference memory block stores, in response to a first direct access command received from the outside, an indicator indicating the first memory block as an indication. The first physical area of the first memory block, in which the first data are stored, may be accessed according to the indication of the indicator and a page address received from the outside together with the first direct access command.

According to an exemplary embodiment, a storage device includes a controller and a nonvolatile memory. The nonvolatile memory includes a first memory block and a reference memory block. The controller is configured to generate a first direct access command and a page address. The first memory block includes a first physical area in which first data are stored. The reference memory block stores, in response to a first direct access command, an indicator indicating the first memory block as an indication. The controller is configured to access the first physical area, in which the first data are stored, of the first memory block according to the page address and the indication of the first indicator.

According to an exemplary embodiment, a nonvolatile memory device includes multiple memory blocks and is controlled by a controller. The multiple memory blocks include a first memory block and a reference memory block. The first memory block includes a first physical area which stores first data to be read. An operating method of the nonvolatile memory device includes receiving a first direct access command and a page address at the nonvolatile memory device from the controller. The operating method also includes, indicating, by an indicator stored in the reference memory block, the first memory block in response to the first direct access command. The operating method also includes accessing the first physical area, which stores the first data to be read, of the first memory block, according to the page address and the indication of the indicator.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Below, embodiments of the present disclosure may be described in detail and clearly to such an extent that one of ordinary skill in the art easily implements the teachings of the present disclosure.

Figure 1:
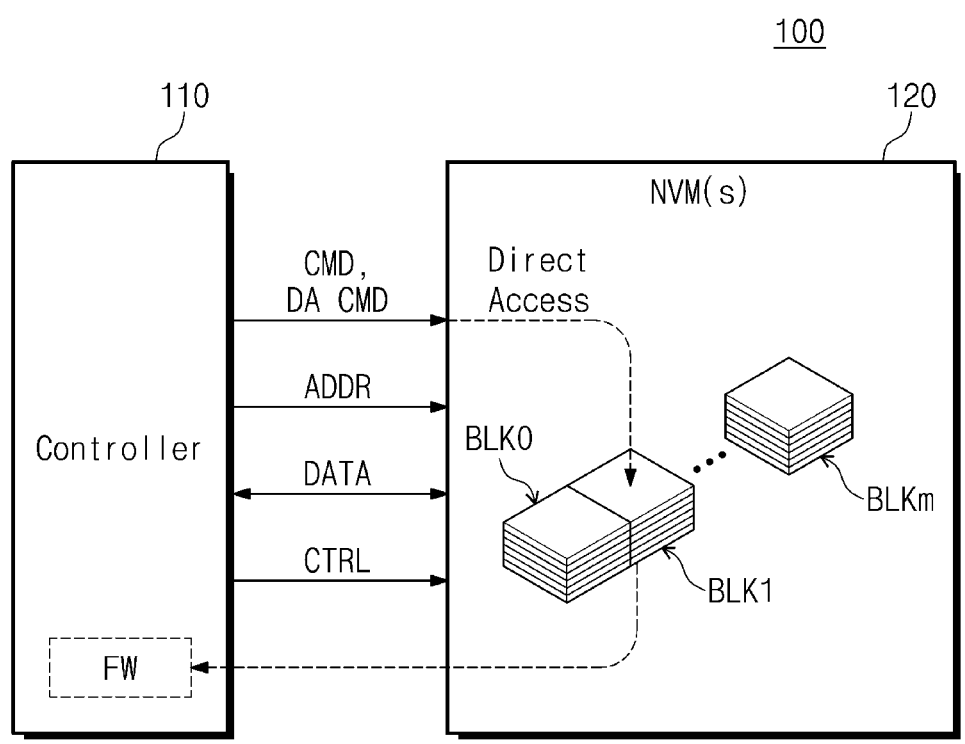
FIG. 1 is a block diagram illustrating aspects of an exemplary configuration of a storage device, according to an embodiment of the present disclosure.

FIG. 1 is a block diagram illustrating aspects of an exemplary configuration of a storage device, according to an embodiment of the present disclosure. A storage device 100 may include a controller 110 and a nonvolatile memory device 120. For example, the storage device 100 may be implemented with a storage medium such as a solid-state drive (SSD), a memory card, or a memory stick.

The controller 110 may control the nonvolatile memory device 120 in response to a request from (e.g., by) the outside (e.g., a host). For example, the controller 110 may transmit a command CMD, an address ADDR, and a control signal CTRL to the nonvolatile memory device 120 to store data "DATA" in the nonvolatile memory device 120 or read data "DATA" from the nonvolatile memory device 120. In response to signals received from the controller 110, the nonvolatile memory device 120 may store the data "DATA" or may provide stored data "DATA" to the controller 110.

The controller 110 may control the nonvolatile memory device 120 depending on an internal request (e.g., an operation of loading firmware, a wear leveling operation, a read reclaim operation, and the like) without a request from (e.g., by) the outside (e.g., a host). An operation of controlling the nonvolatile memory device 120 without a request from (e.g., by) a host may be performed within the storage device 100, for example, at booting-on, during a runtime, or during an idle period.

The nonvolatile memory device 120 may include multiple memory blocks BLK1 to BLKm. The memory blocks BLK1 to BLKm may correspond to a memory area (e.g., logical and/or physical arrangement of memory cells) that is allocated to a user so as to read and/or store data. The nonvolatile memory device 120 may further include a reference memory block BLK0. The reference memory block BLK0 may be an area that is allocated to a memory vendor (or manufacturer) so as to manage aspects of the nonvolatile memory device 120.

In an embodiment, information that is needed to implement an addressing rule proposed by the present disclosure may be stored in the reference memory block BLK0. For example, the information stored in the reference memory block BLK0 may include direct access information indicating the memory block BLK1 in response to a direct access command DA CMD received from the controller 110. The direct access information may allow the controller 110 to access a specific area of the nonvolatile memory device 120 by using only a page address without a block address, even when some, most or all other types of access use a block address.

In an embodiment, the controller 110 may be configured to access a memory block (e.g., BLK1) without a block address. For example, the controller 110 may transmit the direct access command DA CMD to the nonvolatile memory device 120. The direct access command DA CMD may refer to a command for accessing the first memory block BLK1 indicated by the reference memory block BLK0. If the direct access command DA CMD is transmitted to the nonvolatile memory device 120, the controller 110 may directly access the first memory block BLK1 at the direction of instructions and/or information in/from the reference memory block BLK0, and thus, firmware FW stored in the first memory block BLK1 may be loaded.

In an embodiment, the controller 110 may directly access the first memory block BLK1 by using the direct access command DA CMD and a page address at booting-on of the storage device 100 or during a runtime of the storage device 100. In addition, the controller 110 may directly access multiple memory blocks by using multiple direct access commands by using page addresses without block addresses. Also, a memory block such as memory block BLK1 referenced by (e.g., set in, pointed by/from) the reference memory block BLK0 may be changed in response to a direct access command from the controller 110. As briefly described above, according to a scheme (or an addressing rule) of the present disclosure in which the nonvolatile memory device 120 is accessed by using only a page address without a block address, a problem due to different addressing rules of memory vendors manufacturing a nonvolatile memory device may be solved. A scheme to access the nonvolatile memory device 120 by using only a page address without a block address will be more fully described later.

Figure 2:
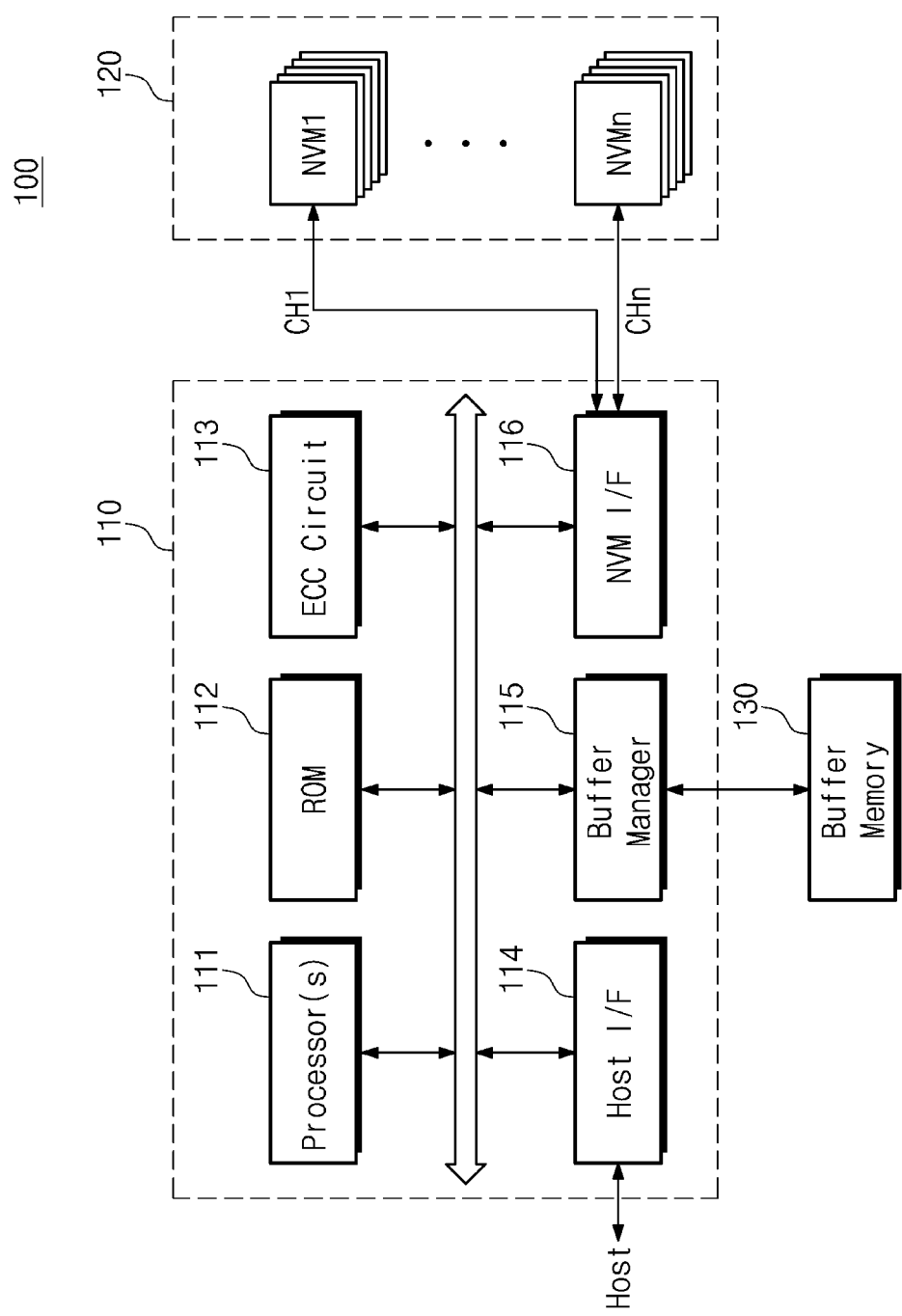
FIG. 2 is a block diagram illustrating additional aspects of the exemplary configuration of the storage device illustrated in FIG. 1.

FIG. 2 is a block diagram illustrating additional aspects of the exemplary configuration of the storage device 100 illustrated in FIG. 1. The controller 110 may include a processor 111 or multiple such processors, a ROM 112 (read only memory), and an ECC circuit 113 (error-correcting code circuit). In addition, the controller 110 may further include a host interface 114 for performing interfacing with a host in compliance with various protocols, a buffer manager 115 for managing/controlling a buffer memory 130, and a nonvolatile memory interface 116 for performing interfacing with the nonvolatile memory device(s) 120.

The processor 111 may control overall operations of the controller 110. The processor 111 may execute various firmware/software needed to drive the controller 110 or to control the nonvolatile memory devices 120. For example, the processor 111 may drive (execute or implement) a flash translation layer (FTL) for managing a mapping table in which a relationship between logical addresses and physical addresses of multiple nonvolatile memories NVM1 to NVMn is defined.

The ROM 112 may store a boot code needed to boot the storage device 100. In addition, the ROM 112 may store separate firmware for loading firmware stored in the nonvolatile memory device 120 onto the buffer memory 130. For example, the firmware stored in the ROM 112 may be executed at booting-on of the storage device 100 or may be executed by the outside (host) by an internal request during a runtime of the storage device 100.

The ECC circuit 113 may detect and correct an error of data loaded from the nonvolatile memory device 120. For example, if the firmware stored in the nonvolatile memory device 120 is loaded onto the buffer memory 130 as separate firmware stored in the ROM 112 is executed, the ECC circuit 113 may detect and correct an error of the loaded firmware from the nonvolatile memory device 120.

The host interface 114 may perform communication with a host by using a bus with various communication protocols. For example, a bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), and universal flash storage (UFS).

The nonvolatile memory device 120 may include the nonvolatile memories NVM1 to NVMn for storing data. For example, in the case where the nonvolatile memory device 120 includes a NAND flash memory, the nonvolatile memory device 120 may include arrays of memory cells formed along multiple word lines and multiple bit lines.

However, the above example may not limit the present disclosure. The nonvolatile memory device 120 may include one or more of various nonvolatile memory devices such as an electrically erasable and programmable ROM (EEPROM), a NOR flash memory, a phase-change RAM (PRAM), a resistive RAM (ReRAM), a ferroelectric RAM (FRAM), a spin-torque magnetic RAM (STT-MRAM), and the like. For better understanding, in the following description, it may be assumed that the nonvolatile memory device 120 includes NAND flash memories. However, configurations of the nonvolatile memory device 120 may be variously changed or modified.

The buffer memory 130 may store data to be used for an operation of the storage device 100. The buffer memory 130 may temporarily store data processed or to be processed by the processor 111. For example, the buffer memory 130 may store firmware loaded from the nonvolatile memory device 120. For example, the buffer memory 130 may include a volatile memory, such as a dynamic random-access memory (DRAM), a synchronous DRAM (SDRAM), or the like, and/or a nonvolatile memory, such as a PRAM, a magneto-resistive RAM (MRAM), a ReRAM, an FRAM, or the like.

Figure 3:
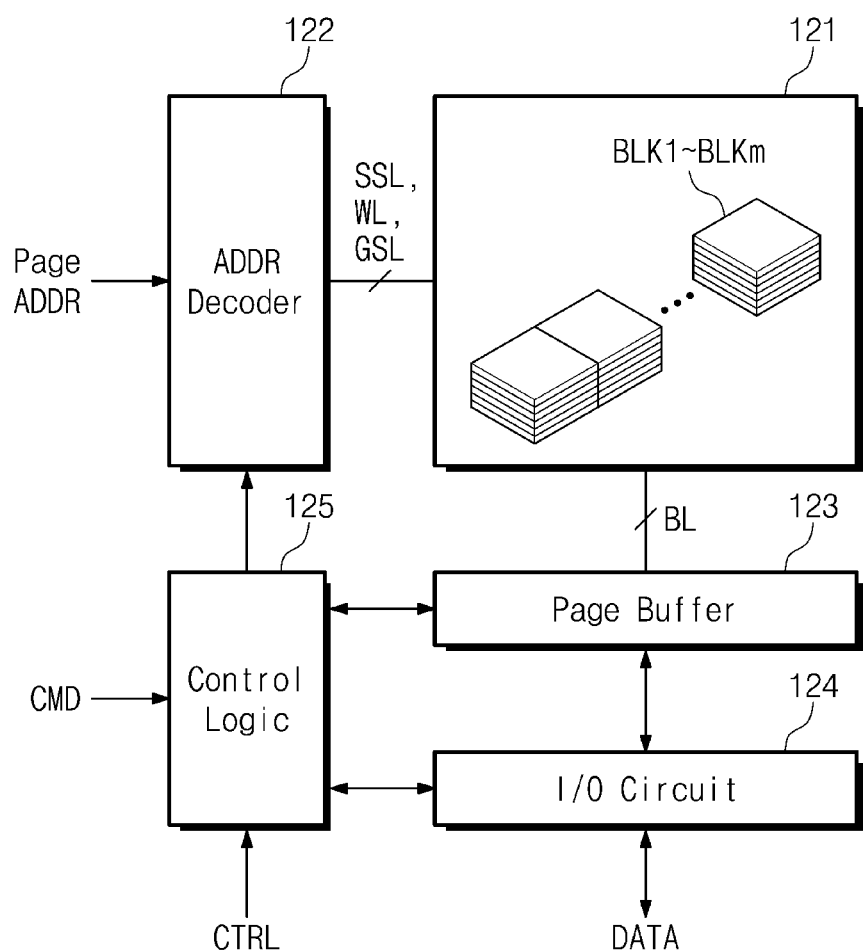
FIG. 3 is a block diagram illustrating an exemplary configuration of a nonvolatile memory device illustrated in FIG. 2.

FIG. 3 is a block diagram illustrating an exemplary configuration of the nonvolatile memory device 120 illustrated in FIG. 2. Referring to FIG. 3, the nonvolatile memory device 120 may include a memory cell array 121, an address decoder 122, a page buffer 123, an input/output circuit 124, and control logic 125.

The memory cell array 121 may include multiple memory blocks. Each of the memory blocks may include multiple cell strings. Each of the cell strings may include multiple memory cells as serially connected memory cells. The memory cells may be connected with multiple word lines WL. Each memory cell may be a single level cell (SLC) storing one bit or a multi-level cell (MLC) storing at least two bits.

The address decoder 122 is connected with the memory cell array 121 through the word lines WL, string selection lines SSL, and ground selection lines GSL. The address decoder 122 may receive an address ADDR (e.g., a page address) from the outside and may decode the received address ADDR to drive a corresponding word line WL. For example, the address ADD may be a physical address of the nonvolatile memory device 120 which is obtained by converting a logical address. The above-described address conversion operation may be performed by a controller (e.g., 110 of FIG. 1) according to the present disclosure or by the flash translation layer (FTL) driven by the controller 110.

The page buffer 123 is connected with the memory cell array 121 through multiple bit lines BL. Under control of the control logic 125, the page buffer 123 may control the bit lines BL such that data "DATA" received from the input/output circuit 124 are stored in the memory cell array 121. Under control of the control logic 125, the page buffer 123 may read data stored in the memory cell array 121 and may provide the read data to the input/output circuit 124. In an embodiment, the page buffer 123 may receive data from the input/output circuit 124 by the page or may read data from the memory cell array 121 by the page. That is, a page may be a unit size of the page buffer 123, and may correspond to the unit size by which data is received from the input/output circuit 124 or by which data is read from the memory cell array 121.

The input/output circuit 124 may receive data "DATA" from an external device and may provide the received data to the page buffer 123.

The control logic 125 may control the address decoder 122, the page buffer 123, and the input/output circuit 124 in response to a command CMD and a control signal CTRL from the outside. For example, the control logic 125 may control other components in response to the command CMD and the control signal CTRL such that data "DATA" are stored in the memory cell array 121. Alternatively, the control logic 125 may control other components in response to the command CMD and the control signal CTRL such that data "DATA" stored in the memory cell array 121 are transmitted to the external device. The control signal CTRL may be a signal that the controller 110 provides to control the nonvolatile memory device 120.

The control logic 125 may generate various voltages needed for the nonvolatile memory device 120 to operate. For example, the control logic 125 may generate multiple program voltages, multiple pass voltages, multiple selection read voltages, multiple non-selection read voltages, multiple erase voltages, multiple verification voltages, and the like. The control logic 125 may provide the generated voltages to the address decoder 122 or to a substrate of the memory cell array 121.

Figure 4:
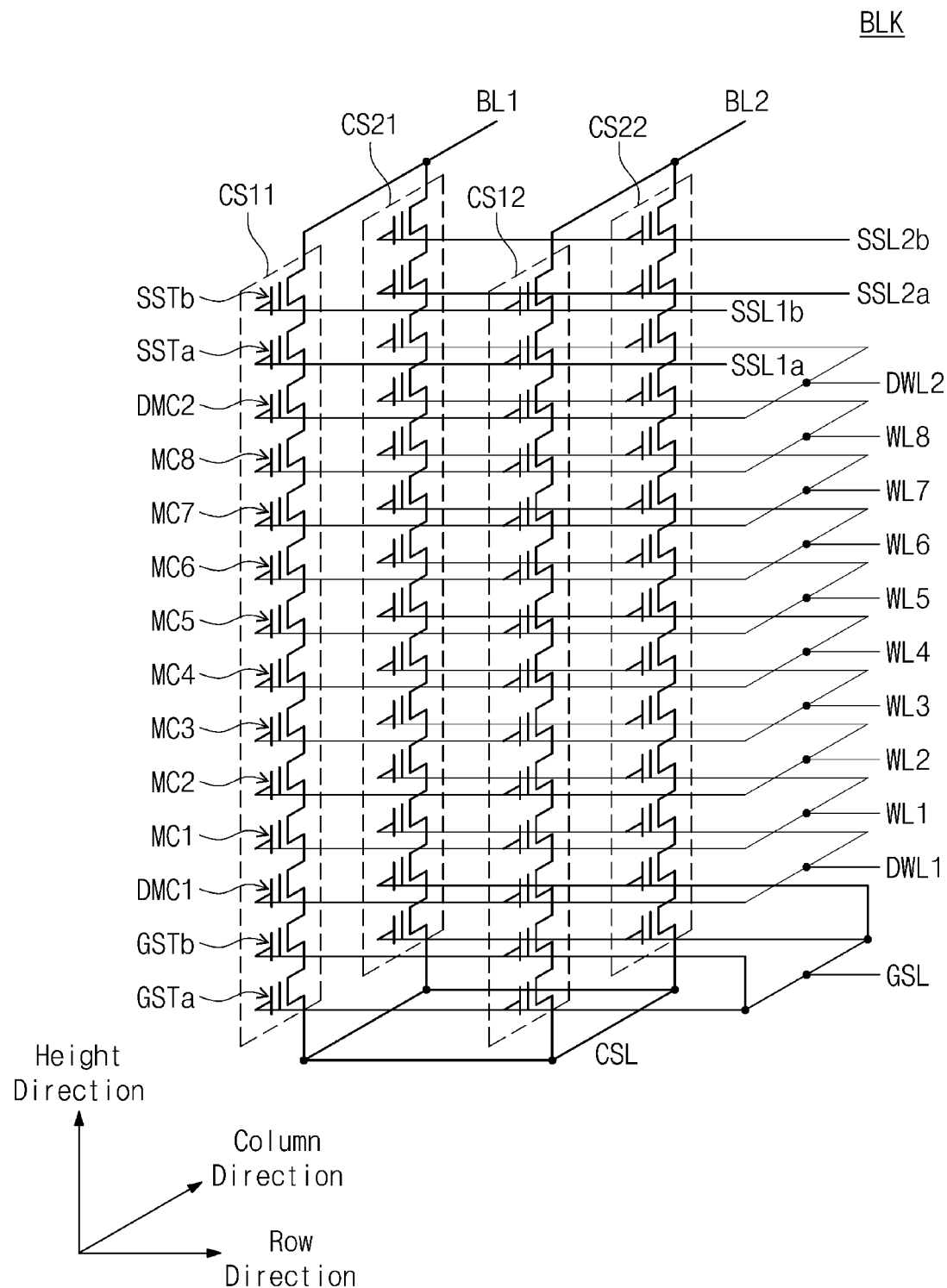
FIG. 4 is a circuit diagram schematically illustrating a memory block included in a cell array of a memory cell array in FIG. 3.

FIG. 4 is a circuit diagram illustrating a memory block included in a memory cell array in FIG. 3. In an embodiment, a memory block BLK of a three-dimensional structure will be described with reference to FIG. 4.

Referring to FIG. 4, the memory block BLK includes multiple cell strings S11 to CS12 and CS21 to CS22. The cell strings CS11, CS12, CS21, and CS22 may be arranged along a row direction and a column direction to form rows and columns.

For example, the cell strings CS11 and CS12 may be connected to string selection lines SSL1a and SSL1b to constitute a first row. The cell strings CS21 and CS22 may be connected to string selection lines SSL2a and SSL2b to constitute a second row. For example, the cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include multiple cell transistors. For example, each of the cell strings CS11, CS12, CS21, and CS22 may include string selection transistors SSTa and SSTb, multiple memory cells MC1 to MC8, ground selection transistors GSTa and GSTb, and dummy memory cells DMC1 and DMC2. In an embodiment, each of the memory cells included in the cell strings CS11, CS12, CS21, and CS22 may be a charge trap flash (CTF) memory cell.

The memory cells MC1 to MC8 may be serially connected and may be stacked in a height direction that is a direction perpendicular to a plane defined by the row direction and the column direction. In each cell string, the string selection transistors SSTa and SSTb may be serially connected and may be arranged between the memory cells MC1 to MC8 and a bit line BL1 or BL2. In each cell string, the ground selection transistors GSTa and GSTb may be serially connected and may be arranged between the memory cells MC1 to MC8 and a common source line CSL.

In an embodiment, in each cell string, a first dummy memory cell DMC1 may be arranged between the memory cells MC1 to MC8 and the ground selection transistors GSTa and GSTb. In an embodiment, in each cell string, a second dummy memory cell DMC2 may be arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an embodiment, ground selection transistors in the same row may be connected to the same ground selection line, and ground selection transistors in different rows may be connected to another ground selection line. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an embodiment, even though not illustrated in FIG. 4, ground selection transistors provided at the same height from a substrate (not illustrated) may be connected to the same ground selection line, and ground selection transistors provided at different heights may be connected to different ground selection lines. For example, in the cell strings CS11, CS12, CS21, and CS22, the first ground selection transistors GSTa may be connected to the first ground selection line, and the second ground selection transistors GSTb may be connected to the second ground selection line.

Memory cells arranged at the same height from the substrate (or the ground selection transistors GSTa and GSTb) may be connected in common to the same word line, and memory cells arranged at different heights therefrom may be connected to different word lines. For example, memory cells MC1 to MC8 of the cell strings CS11, CS12, CS21, and CS22 may be connected to corresponding word lines of the first to eighth word lines WL1 to WL8 at the same height, respectively.

String selection transistors, which belong to the same row, from among the first string selection transistors SSTa arranged at the same height may be connected to the same string selection line. String selection transistors, which belong to different rows, from among the first string selection transistors SSTa may be connected to different string selection lines. For example, the first string selection transistors SSTa of the cell strings CS11 and CS12 in the first row may be connected in common to the string selection line SSL1a, and the first string selection transistors SSTa of the cell strings CS21 and CS22 in the second row may be connected in common to the string selection line SSL2a.

String selection transistors, which belong to the same row, from among the second string selection transistors SSTb arranged at the same height may be connected to the same string selection line. String selection transistors, which belong to different rows, from among the second string selection transistors SSTb may be connected to different string selection lines. For example, the second string selection transistors SSTb of the cell strings CS11 and CS12 in the first row may be connected in common to the string selection line SSL1b, and the second string selection transistors SSTb of the cell strings CS21 and CS22 in the second row may be connected in common to the string selection line SSL2b.

Even though not illustrated, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an embodiment, dummy memory cells at the same height may be connected with the same dummy word line, and dummy memory cells at different heights may be connected with different dummy word lines. For example, the first dummy memory cells DMC1 may be connected to a first dummy word line DWL1, and the second dummy memory cells DMC2 may be connected to a second dummy word line DWL2.

In the memory block BLK, read and write operations may be performed by the row. For example, a row of the first memory block BLK may be selected by the string selection lines SSL1a, SSL1b, SSL2a, and SSL2b.

For example, the cell strings CS11 and CS12 in the first row may be respectively connected to the bit lines BL1 and BL2 when a turn-on voltage is supplied to the string selection lines SSL1a and SSL1b and a turn-off voltage is supplied to the string selection lines SSL2a and SSL2b. The cell strings CS21 and CS22 in the second row may be respectively connected to the bit lines BL1 and BL2 when the turn-on voltage is supplied to the string selection lines SSL2a and SSL2b and the turn-off voltage is supplied to the string selection lines SSL1a and SSL1b. Memory cells, which are arranged at the same height, from among memory cells in cell strings connected to a word line may be selected by driving the word line. Read and write operations may be performed with respect to the selected memory cells. The selected memory cells may constitute a physical page unit.

In the first memory block BLK1, memory cells may be erased by the memory block or by the sub-block. When an erase operation is performed by the memory block, all memory cells MC in the memory block BLK1 may be simultaneously erased according to an erase request. When the erase operation is performed by the sub-block, some of memory cells MC in the memory block BLK1 may be simultaneously erased according to an erase request while the remaining memory cells thereof may be erase-inhibited. A low voltage (e.g., a ground voltage) may be supplied to a word line connected to erased memory cells, and a word line connected to erase-inhibited memory cells MC may be floated.

In an embodiment, the memory block BLK illustrated in FIG. 4 is only an example. The number of cell strings may increase or decrease, and the number of rows of cell strings and the number of columns of cell strings may increase or decrease according to the number of cell strings. In the memory block BLK, the number of cell transistors (GST, MC, DMC, SST, etc.) may increase or decrease, and a height of the memory block BLK may increase or decrease according to the number of cell transistors (GST, MC, DMC, SST, etc.). Also, the number of lines (GSL, WL, DWL, SSL, etc.) connected with transistors may increase or decrease depending on the number of the transistors.

Figure 5:
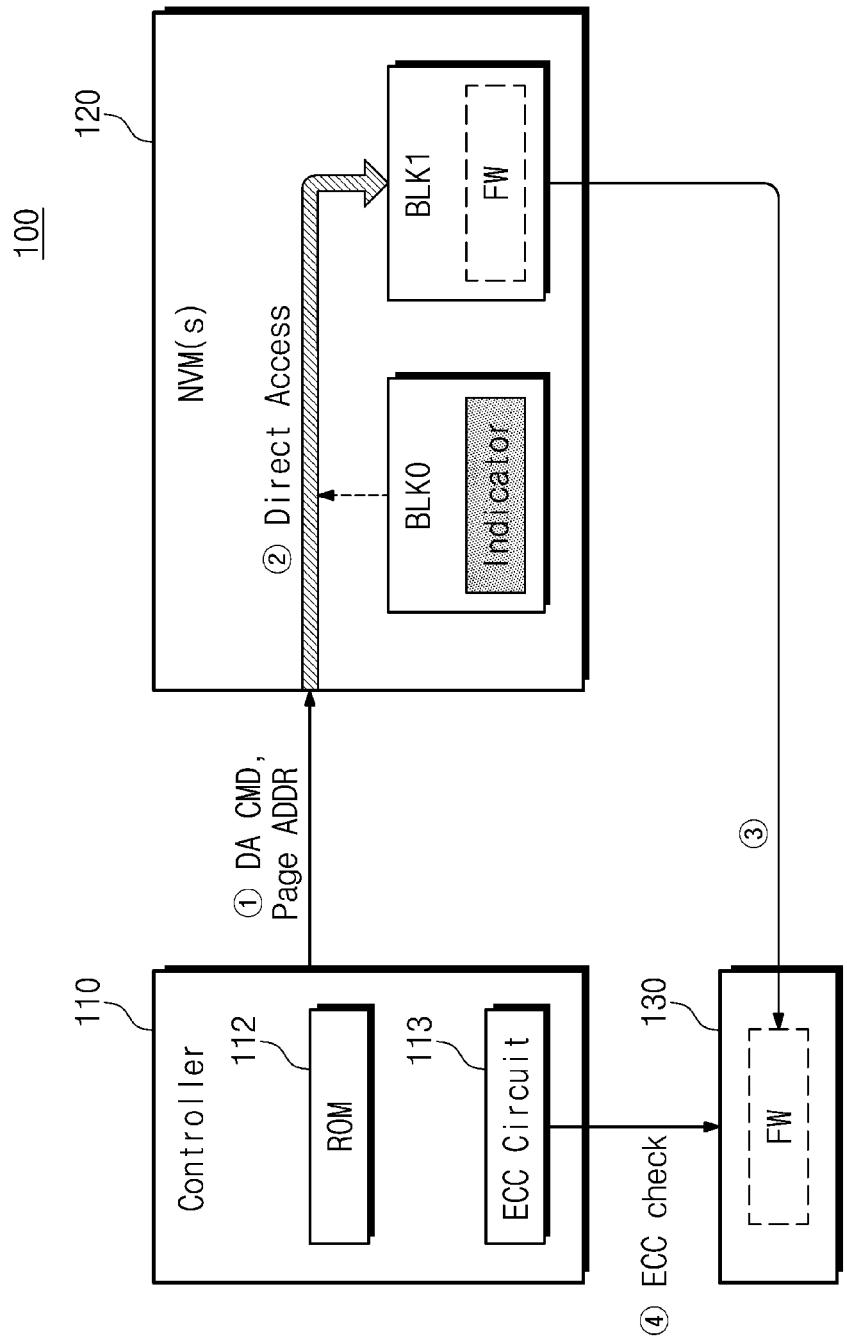
FIG. 5 is a block diagram for conceptually illustrating an addressing rule, according to an embodiment of the present disclosure.

FIG. 5 is a block diagram for conceptually illustrating an addressing rule, according to an embodiment of the present disclosure. In an embodiment, the memory blocks BLK0 and BLK1 of multiple memory blocks included in the nonvolatile memory device 120 are illustrated. The reference memory block BLK0 may be a block which stores an indicator indicating the first memory block BLK1. The first memory block BLK1 may be a memory block which stores the firmware FW to be loaded. For better understanding, a description of FIG. 5 will be given together with reference to aspects of FIG. 3.

If the storage device 100 is booted on, the controller 110 may load the firmware FW needed to drive/operate the storage device 100 onto the buffer memory 130. To load the firmware FW, the controller 110 may transmit the direct access command DA CMD to the nonvolatile memory device 120. For example, the direct access command DA CMD may be any one of at least two commands included in a command sequence. In addition, the controller 110 may transmit a page address to the nonvolatile memory device 120. For example, the page address may indicate a physical address of the firmware FW to be loaded, i.e., a physical address at which the firmware FW is stored. However, the page address may not include a block address of an area where the firmware FW is stored (the above description corresponds to operation ①).

The nonvolatile memory device 120 may parse the direct access command DA CMD. As the control logic 125 (refer to FIG. 3) parses the direct access command DA CMD, the first memory block BLK1 may be indicated by an indicator stored in the reference memory block BLK0. That is, the controller 110 may access the first memory block BLK1 indicated by an indicator stored in the reference memory block BLK0, without a block address of a physical area where the firmware FW is stored. In addition, the controller 110 may access a physical area indicated by the page address (the above description corresponds to operation ②).

Afterwards, the firmware FW stored in the first memory block BLK1 may be loaded onto the buffer memory 130 (operation ③), and the ECC circuit 113 provided in the controller 110 may check whether an error is present in the loaded data (i.e., the firmware FW) (operation ④). If an error is absent from the loaded firmware FW or if an error detected from the firmware FW is corrected by the ECC circuit 113, the loaded firmware FW may operate normally. In contrast, if the detected error is uncorrectable, the controller 110 may use another scheme for driving the firmware FW normally, which will be more fully described with reference to another embodiment.

Figure 6:
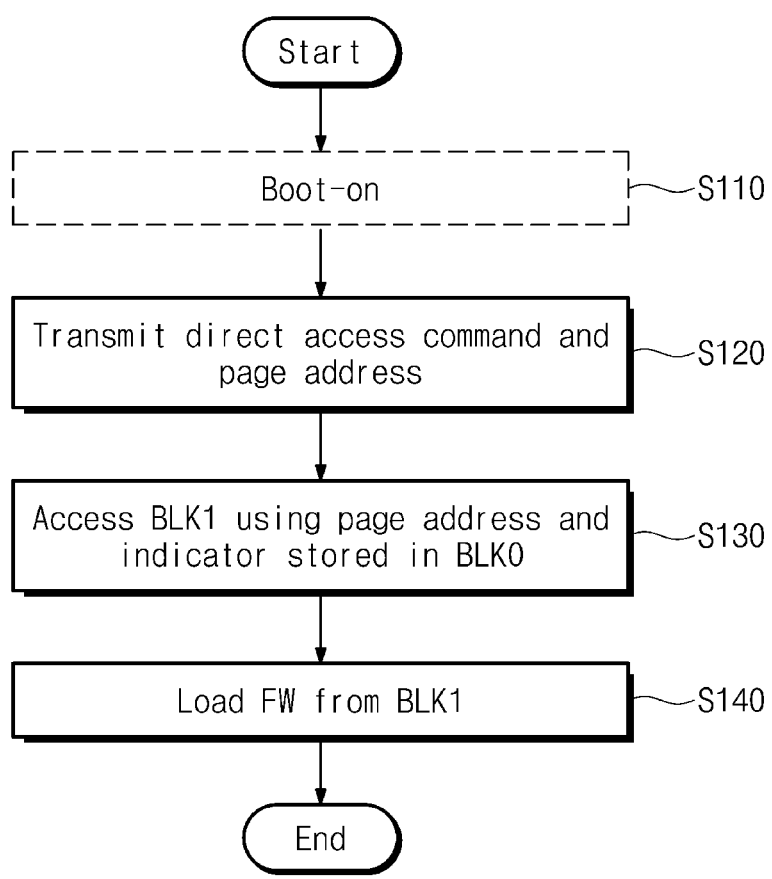
FIG. 6 is a flowchart illustrating a method of accessing a physical area in which firmware is stored, without a block address, according to an embodiment of the present disclosure.

FIG. 6 is a flowchart illustrating a method of accessing a physical area in which firmware is stored, without a block address, according to an embodiment of the present disclosure. For better understanding, a description of FIG. 6 will be given together with reference to aspects of FIGS. 3 and 5.

In operation S110, the storage device 100 may be booted on. However, operation S110 may be omitted. In other words, the teachings of the present disclosure may be applied during a runtime of the storage device 100, in addition to firmware loading after the storage device 100 is booted on.

In operation S120, the direct access command DA CMD and a page address may be transmitted to the nonvolatile memory device 120. For example, the direct access command DA CMD may be any one of at least two commands included in a command sequence. For example, after the first command among two commands included in the command sequence is transmitted, the page address may be transmitted. Then, the second direct access command DA CMD among the two commands included in the command sequence may be transmitted.

In the case of performing a read operation on a nonvolatile memory device according to a general read scheme, a block address of a physical address of data to be read (i.e., where the data to be read is stored) is transmitted together with a page address. However, according to the present disclosure, a block address may not be transmitted. In contrast, the direct access command DA CMD is transmitted. The direct access command DA CMD is directed to (e.g., references or refers to) the reference memory block BLK0 that stores an indicator indicating a physical area of data to be read (i.e., where the data to be read is stored).

In operation S130, a physical area where firmware to be read is stored may be accessed by using the page address and an indicator stored in the reference memory block BLK0. For example, the control logic 125 may parse the direct access command DA CMD. The parsing may result in the controller 110 accessing the first memory block BLK1 where the firmware is stored. Accordingly, the controller 110 may access the first memory block BLK1 without a block address. In addition, the controller 110 may access a page area of the first memory block BLK1, which is indicated by the page address.

In operation S140, firmware stored in the first memory block BLK1 may be loaded. For example, the ECC circuit 113 may perform error checking and correcting on the firmware loaded onto the buffer memory 130.

Figure 7:
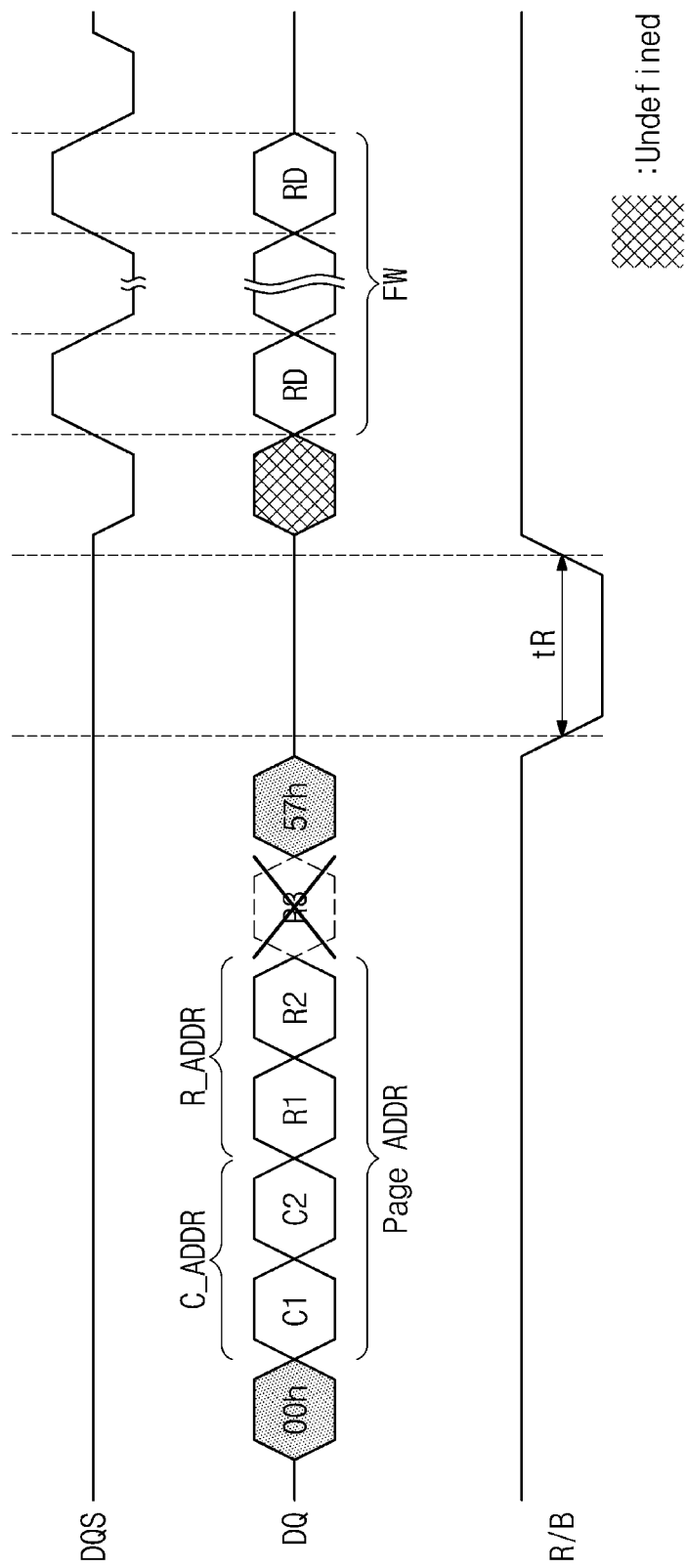
FIG. 7 is a timing diagram illustrating signals input to a nonvolatile memory device and signals output from the nonvolatile memory device, in applying an addressing rule, according to an embodiment of the present disclosure.

FIG. 7 is a timing diagram illustrating signals input to a nonvolatile memory device and signals output from the nonvolatile memory device, in applying an addressing rule, according to an embodiment of the present disclosure. Signals are marked by DQ. In addition, a data strobe signal DQS and a ready/busy signal R/B are illustrated together. For better understanding, a description of FIG. 7 will be given together with reference to aspects of FIGS. 3 and 5.

In booting-on of the storage device 100 or even during a runtime of the storage device 100, firmware may be executed or a boot code that is stored in the ROM 112 may be executed. In the case of a boot code, the boot code stored in the ROM 112 is used to load firmware stored in the nonvolatile memory device 120. As the firmware or boot code stored in the ROM 112 is executed, the controller 110 may transmit the direct access command DA CMD and a page address of a physical area where firmware is stored, to the nonvolatile memory device 120.

As illustrated in FIG. 7, the controller 110 may transmit a first command 00h, column addresses C1 and C2, row addresses R1 and R2, and a second command 57h to the nonvolatile memory device 120. The column addresses C1 and C2 and the row addresses R1 and R2 constitute the page address. According to a general addressing rule, a row address R3 associated with a block address is transmitted together in addition to the row addresses R1 and R2. However, according to the present disclosure, the R3 associated with a block address may not be transmitted.

Instead, in response to the second command 57h, the first memory block BLK1 to be accessed may be indicated by an indicator stored in the reference memory block BLK0. For example, the second command 57h may be a command to access the indicator stored in the reference memory BLK0, which in turn will result in access to the first memory block BLK1. After the first memory block BLK1 is identified from the indicator stored in the reference memory BLK0, a physical area corresponding to the page address may be accessed. The physical area may correspond to a physical area of the first memory block BLK1. As described above, firmware may be stored in the physical area. That is, a read operation of loading the firmware may be performed in response to the first command 00h and second command 57h. For example, the read operation may be performed during a read time tR. The ready/busy signal R/B may transition to logical low while operations for loading the firmware are performed. After the ready/busy signal R/B transitions to logical high, read data RD may be output from the nonvolatile memory device 120. Of course, the read data RD may be firmware.

According to the above addressing rule, a physical area where firmware is stored may be accessed without a block address. Accordingly, various problems due to different standards may be solved regardless of which memory vendor manufactures the nonvolatile memory device 120. In addition, since a physical area is accessed by using only a page address, the addressing rule may be simplified.

Figure 8:
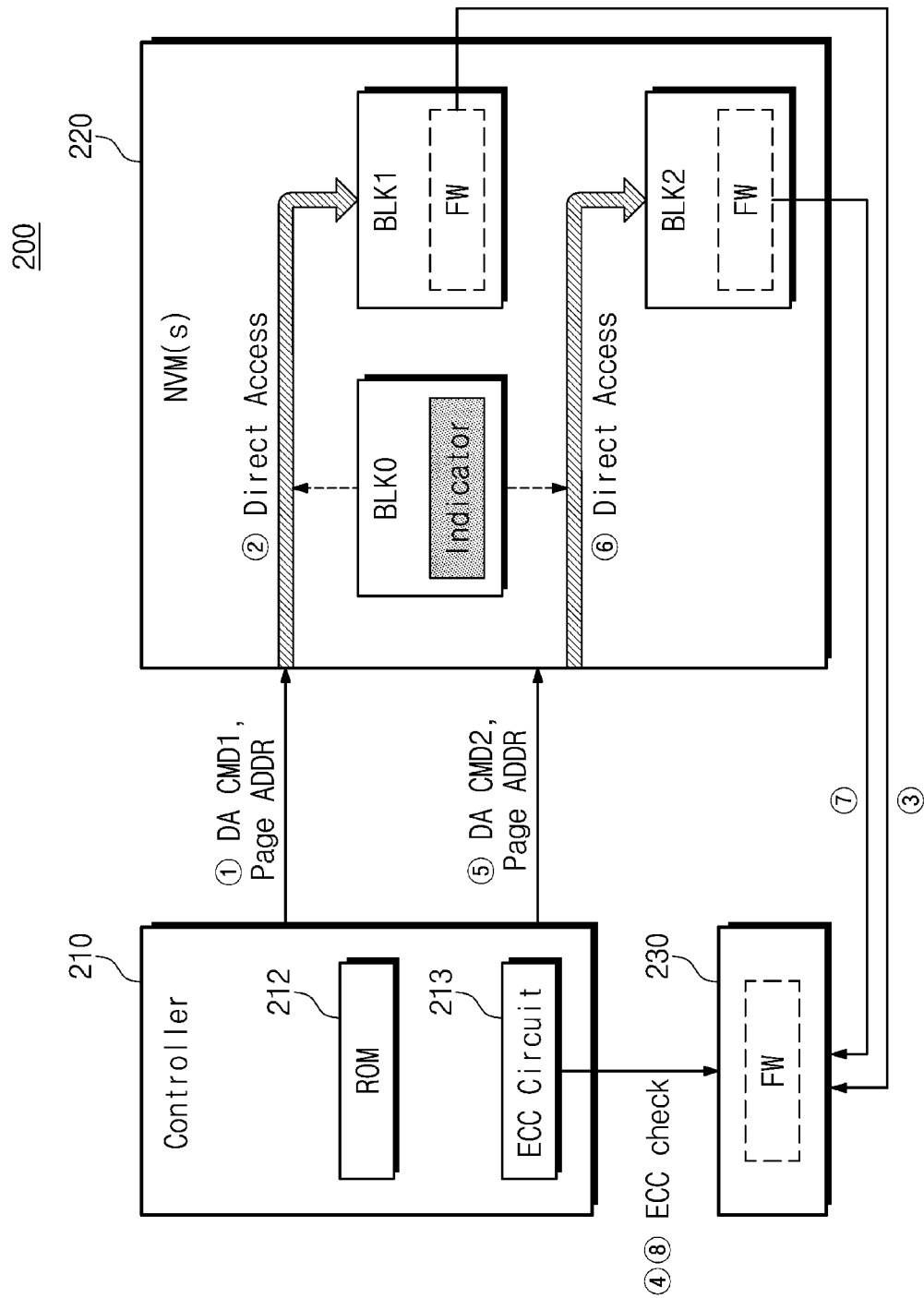
FIG. 8 is a block diagram for conceptually illustrating an addressing rule, according to another embodiment of the present disclosure.

FIG. 8 is a block diagram for conceptually illustrating an addressing rule according to another embodiment of the present disclosure. Unlike the embodiment described above with reference to FIGS. 5 to 7, an embodiment of FIG. 8 will be described as pieces of firmware stored in multiple memory blocks BLK1 and BL2 respectively indicated by multiple direct access command DA CMD1 and DA CMD2. For example, in the case where a memory block which stores firmware is set to a bad block due to an increase in a wearing level, it may be impossible to drive the firmware normally. The embodiment of FIG. 8 may be useful as any one of various solutions associated with the case where an error of firmware loaded onto a buffer memory is uncorrectable.

At booting-on of the storage device 200 or during a runtime of the storage device 200, as a boot code or firmware stored in a ROM 212 is executed, operations may be performed to load the firmware FW stored in the nonvolatile memory device 220. First, a controller 210 may transmit a first direct access command DA CMD1 and a page address to the nonvolatile memory device 220 (operation ①). For example, the first direct access command DA CMD1 may be any one of at least two commands included in a command sequence.

In response to the first direct access command DA CMD1, an indicator stored in the reference memory block BLK0 of the nonvolatile memory device 220 may indicate the first memory block BLK1. The controller 210 may access the first memory block BLK1 indicated by the indicator of the reference memory block BLK0. The controller 210 may access a (first) physical area indicated by the page address and where the firmware FW is stored (the above description corresponds to operation ②).

The firmware FW may be loaded onto the buffer memory 230 as the controller 210 accesses the physical area of the first memory block BLK1 in which the firmware FW is stored (operation ③). Afterwards, an ECC circuit 213 may check and correct an error of the loaded firmware FW (operation ④). If an error is not detected or a detected error is corrected, the firmware FW may be normally driven. However, another direct access command may be used to cope with the case where the detected error is uncorrectable.

To this end, the controller 210 may transmit a second direct access command DA CMD2 and the page address to the nonvolatile memory device 220 (operation ⑤). In this case, the page address transmitted together with the second direct access command DA CMD2 may be the same as the page address transmitted together with the first direct access command DA CMD1 in operation ①. In other words, the same page address may be transmitted to access the firmware in both the first memory block BLK1 and the second memory block BLK2, but with different direct access commands respectively. The reason is that the firmware FW stored in the first memory block BLK1 and the firmware FW stored in the second memory block BLK2 are the same as each other except that the pieces of firmware FW are stored in different memory blocks.

In response to the second direct access command DA CMD2, an indicator stored in the reference memory block BLk0 of the nonvolatile memory device 220 may indicate the second memory block BLK2. The controller 210 may access the second memory block BLK2 indicated by the indicator of the reference memory block BLK0. The controller 210 may access a second physical area indicated by the page address and where the firmware FW is stored (the above description corresponds to operation ⑥). The controller 210 may know to access the second physical area of the second memory block BLK2 rather than the first physical area of the first memory block BLK1 based on the second direct access command DA CMD2 instead of the first direct access command DA CMD1.

The firmware FW may be loaded onto the buffer memory 230 as the controller 210 accesses the (second) physical area of the second memory block BLK2 in which the firmware FW is stored (operation ⑦). Afterwards, the ECC circuit 213 may check and correct an error of the loaded firmware FW (operation ⑧). If an error is not detected or a detected error is corrected, the firmware FW may be normally driven.

An embodiment is described as the controller 210 uses two different direct access commands DA CMD1, and DA CMD2 for the purpose of accessing different memory blocks without an address of a memory block. However, the present disclosure is not limited thereto. For example, three or more direct access commands and three or more memory blocks where the same firmware is stored (i.e., duplicated) may be used.

Figure 9:
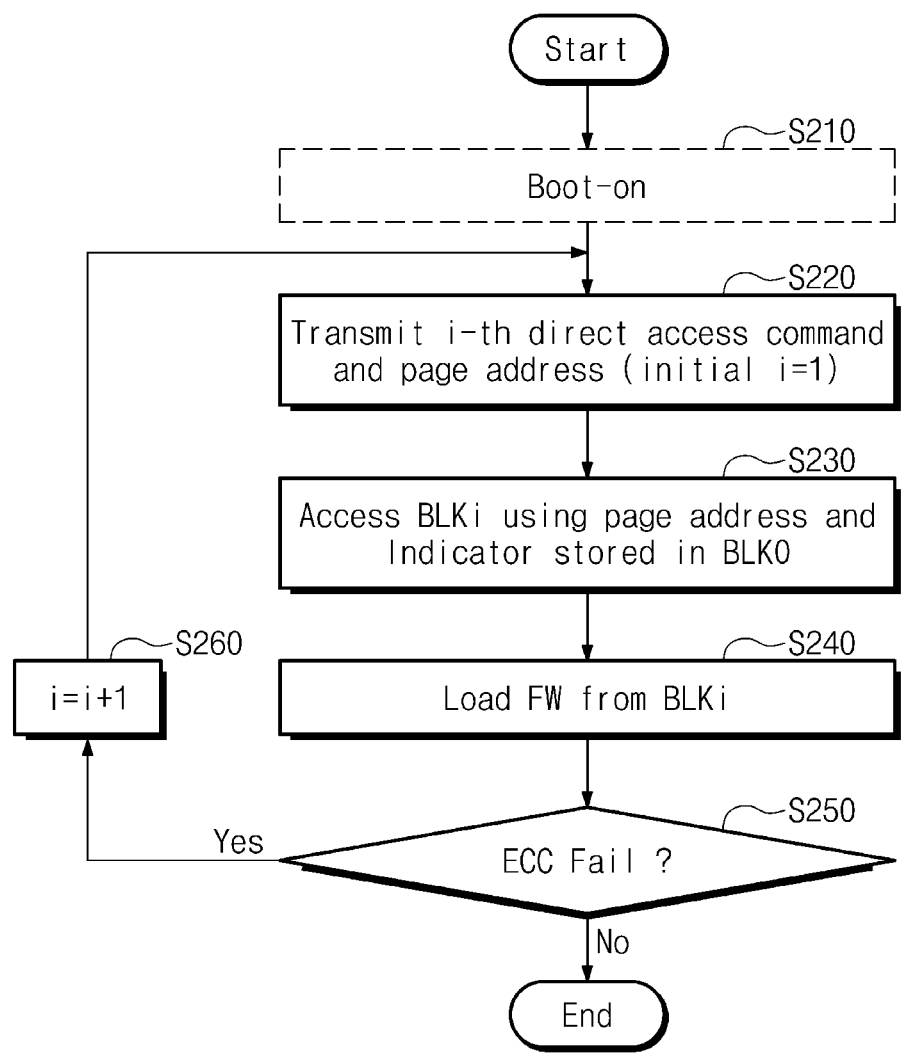
FIG. 9 is a flowchart illustrating a method of accessing a physical area in which firmware is stored, without a block address, according to an embodiment of the present disclosure.

FIG. 9 is a flowchart illustrating a method of accessing a physical area in which firmware is stored, without a block address, according to an embodiment of the present disclosure. For better understanding, a description of FIG. 9 will be given together with reference to aspects of FIGS. 3 and 8.

In operation S210, the storage device 200 may be booted on. However, since the addressing rule of the present disclosure is applied even during a runtime of the storage device 200, operation S210 may be omitted.

In operation S220, an i-th direct access command DA CMDi and a page address may be transmitted to the nonvolatile memory device 220. Here, an initial value of "i" may be "1". For example, the i-th direct access command DA CMDi may be any one of at least two commands included in a command sequence. For example, after the first command among two commands included in the command sequence is transmitted, the page address may be transmitted. Then, the direct access command DA CMDi that is the second direct access command DA CMD among the two commands included in the command sequence may be transmitted.

In operation S230, a physical area where firmware to be read is stored may be accessed by using the page address and an indicator stored in the reference memory block BLK0. For example, the control logic 125 may parse the i-th direct access command DA CMDi, and an i-th memory block BLKi where the firmware is stored may be accessed by the controller 210 according to the parsing result. Accordingly, the controller 210 may access the i-th memory block BLKi without a block address. In addition, the controller 210 may access a page area of the i-th memory block BLKi, which is indicated by the page address.

In operation S240, the firmware stored in the i-th memory block BLKi may be loaded.

In operation S250, the ECC circuit 213 may perform error checking and correcting on the firmware loaded onto the buffer memory 230. If the error check result indicates that an error is absent from the loaded firmware or that a detected error is correctable, the loaded firmware may operate normally. Therefore, the process may terminate.

In contrast, the case where the error check result indicates that an error of the loaded firmware is uncorrectable may correspond to the case where a normal read operation cannot be performed on the i-th memory block BLKi. This event may occur when a wearing level of the i-th memory block BLKi increases, when the i-th memory block BLKi is set to a bad block, and the like. In this case, an operation of loading the firmware from another memory block may be performed. In operation S260, "i" may increase by "1", and the process proceeds again to operation S220 to perform the loading operation on a next memory block of the i-th memory block BLKi.

As operation S220 to operation S250 are performed on the next memory block, the firmware may be driven normally.

Figure 10:
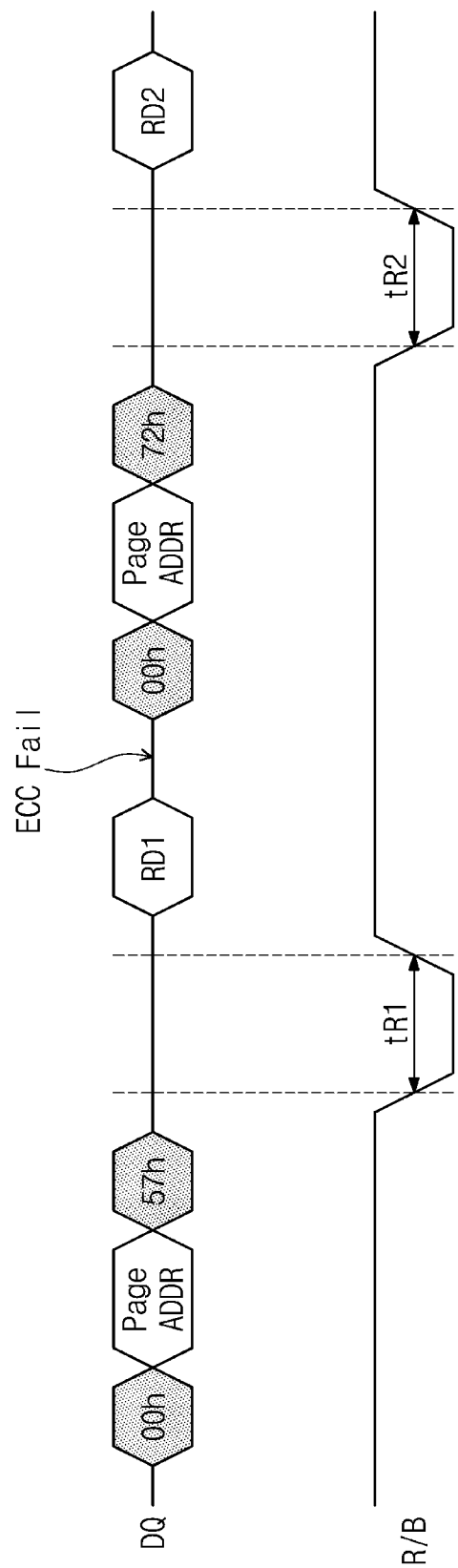
FIG. 10 is a timing diagram illustrating signals input to a nonvolatile memory device and signals output from the nonvolatile memory device, in applying an addressing rule, according to an embodiment of the present disclosure.

FIG. 10 is a timing diagram illustrating signals input to a nonvolatile memory device and signals output from the nonvolatile memory device, in applying an addressing rule, according to an embodiment of the present disclosure. Signals are marked by DQ. In addition, a data strobe signal DQS and a ready/busy signal R/B are illustrated together. For better understanding, a description of FIG. 10 will be given together with reference to aspects of FIGS. 3 and 9.

Firmware or a boot code that is stored in the ROM 212 and is used to load firmware stored in the nonvolatile memory device 220 may be executed. As the firmware or boot code stored in the ROM 212 is executed, the controller 210 may transmit the first direct access command DA CMD1 and a page address of a physical area where firmware is stored, to the nonvolatile memory device 220.

As illustrated in FIG. 10, the controller 210 may transmit a first command 00h, a page address, and a second command 57h to the nonvolatile memory device 220. As in the embodiment described with reference to FIG. 7, the page address may include column addresses C1 and C2 and row addresses R1 and R2 and may not include a row address R3 associated with a block address.

In response to the second command 57h, the first memory block BLK1 that the controller 210 intends to access may be indicated by an indicator stored in the reference memory block BLK0. After the first memory block BLK1 is indicated, a physical area corresponding to the page address may be accessed. As described above, firmware may be stored in the physical area. That is, a read operation of loading the firmware may be performed in response to the first command 00h and second command 57h. After the read/busy signal R/B transitions to logical low and then transition to logical high, first read data RD1 (i.e., firmware) may be output from the first memory block BLK1 of the nonvolatile memory device 220.

However, the event that an error of the loaded first read data RD1 is uncorrectable due to, for example, an increase in a wearing level of the first memory block BLK1 (i.e., ECC fail) may occur. In this case, the second direct access command DA CMD2 for accessing another memory block (e.g., the second memory block BLK2) where the firmware is stored may be additionally used.

The controller 210 may transmit a third command (i.e., the first command 00h transmitted a second time as the third command in the context of FIG. 10), a page address, and a fourth command 72h to the nonvolatile memory device 220. The page address may include column addresses C1 and C2 and row addresses R1 and R2 and may not include a row address R3 associated with a block address. The page address may be the same as the page address transmitted together with the first command 00h and the second command 57h. In other words, the first physical area, the second physical and the third physical area may all have the same page address.

In response to the fourth command 72h, the second memory block BLK2 that the controller 210 intends to access may be indicated by an indicator stored in the reference memory block BLK0. After the second memory block BLK2 is indicated, a physical area corresponding to the page address may be accessed. As described above, firmware may be stored in the physical area. Accordingly, second read data RD2 (i.e., firmware) may be output from the second memory block BLK2 of the nonvolatile memory device 220. For example, the second read data RD2 may be the same as the first read data RD1 except that the second read data RD2 is stored in a memory block different from a memory block where the first read data RD1 is stored.

Figure 11:
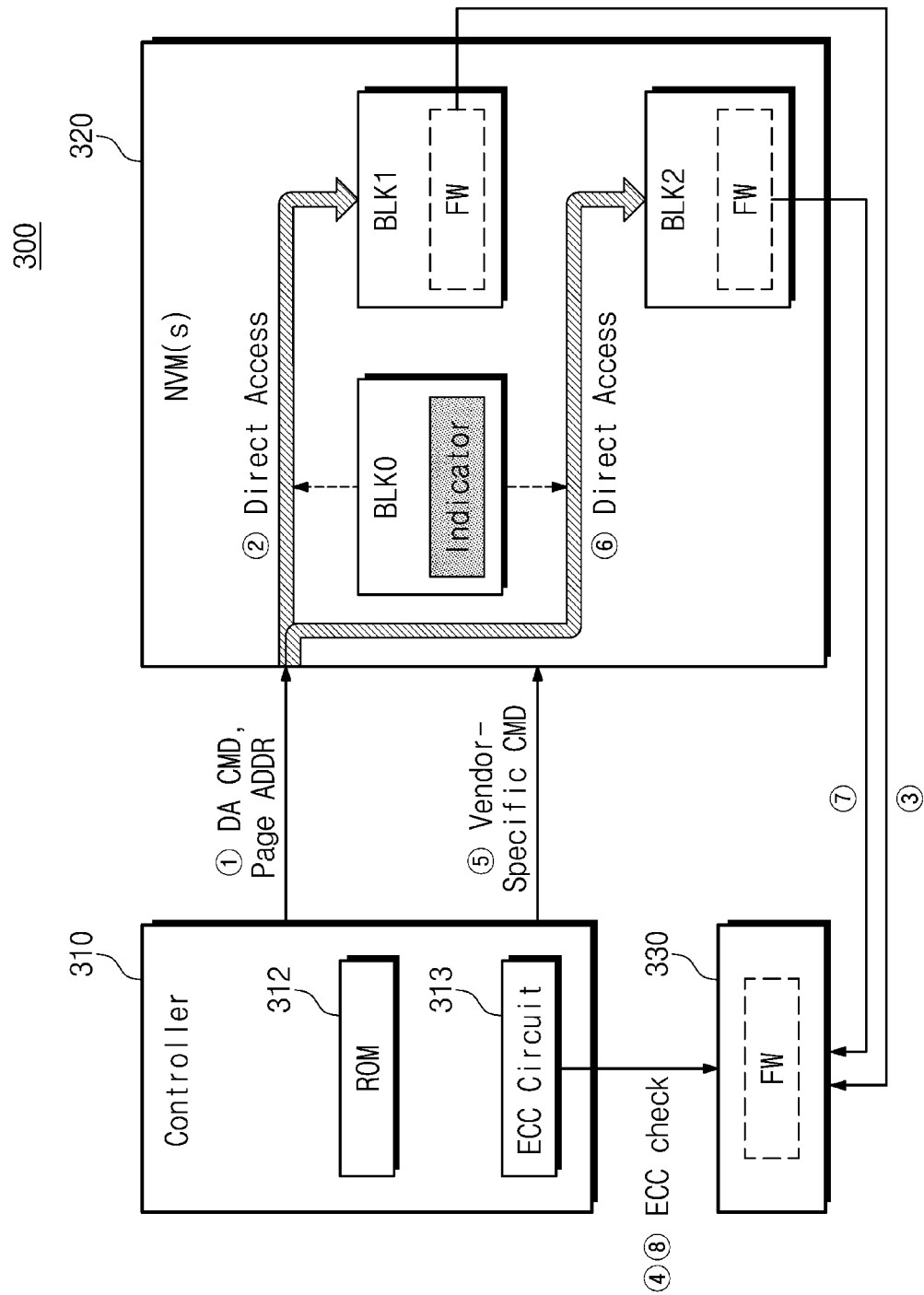
FIG. 11 is a block diagram for conceptually illustrating an addressing rule, according to another embodiment of the present disclosure.

FIG. 11 is a block diagram for conceptually illustrating an addressing rule according to another embodiment of the present disclosure. Unlike the above-described embodiments, in the embodiment of FIG. 11, the firmware FW is loaded from multiple memory blocks BLK1 and BLK2 by using one direct access command DA CMD. That is, in the embodiment of FIG. 11, a memory block indicated by an indicator is changed by changing information of the indicator stored in the reference memory block BLK0.

A controller 310 may transmit the direct access command DA CMD and a page address to a nonvolatile memory device 320 (operation ①). In response to the direct access command DA CMD, the first memory block BLK1 where the firmware FW is stored may be indicated by an indicator stored in the reference memory block BLK0. A space of the first memory block BLK1 in which the firmware FW is stored may be indicated by the page address (operation ②). The firmware FW may be loaded onto a buffer memory 330 as the controller 310 accesses a physical area of the first memory block BLK1 in which the firmware FW is stored (operation ③). An ECC circuit 313 may check and correct an error of the loaded firmware FW (operation ④).

However, in the case where the first memory block BLK1 is set to a bad block, for example, due to an increase in a wearing level, it may be impossible to read the firmware FW from the first memory block BLK1 any more. In this case, the controller 310 may transmit a vendor-specific command to the nonvolatile memory device 320 for the purpose of changing a memory block indicated by an indicator stored in the reference memory block BLK0 (operation ⑤). In response to the vendor-specific command, the nonvolatile memory device 320 may change an indicator to indicate the second memory block BLK2.

Accordingly, the controller 310 may access the second memory block BLK2 indicated by the changed indicator, and may access a physical area of the second memory block BLK2 in which the firmware FW is stored, according to the page address (the above description corresponds to operation ⑥). According to the access operation, the firmware FW stored in the second memory block BLK2 may be loaded onto the buffer memory 330 (operation ⑦), and an ECC circuit 313 may check an error of the loaded firmware FW (operation ⑧). Of course, the firmware FW stored in the second memory block BLK2 and the firmware FW stored in the first memory block BLK1 are the same as each other.

In an embodiment, a block indicated by an indicator is changed by using one vendor-specific command. However, the present disclosure is not limited thereto. For example, the event that an error of a loaded firmware is not corrected through error check and correction of operation ⑧ may occur. In this case, an indicator may be additionally changed to directly access another memory block in which the same firmware as that stored in the first and second memory blocks BLK1 and BLK2 is stored.

Figure 12:
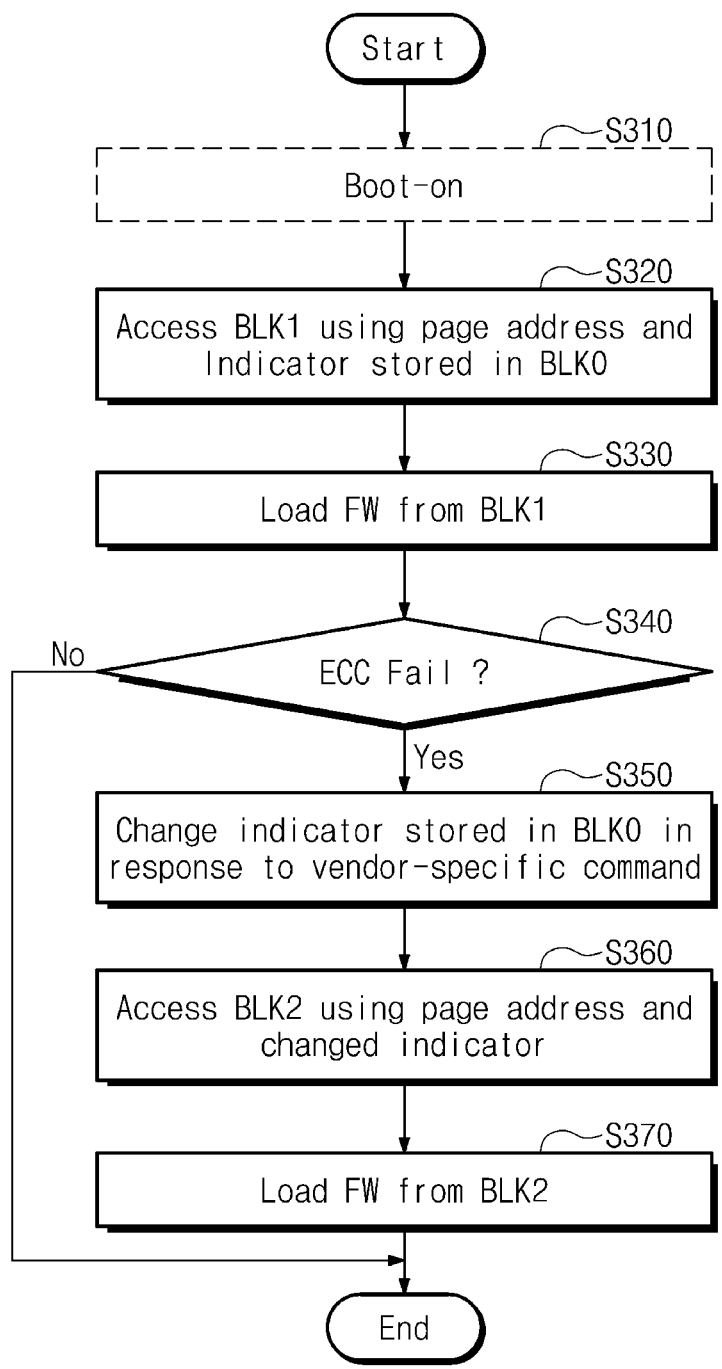
FIG. 12 is a flowchart illustrating a method of accessing a physical area in which firmware is stored, without a block address, according to an embodiment of the present disclosure.
Figure 13:
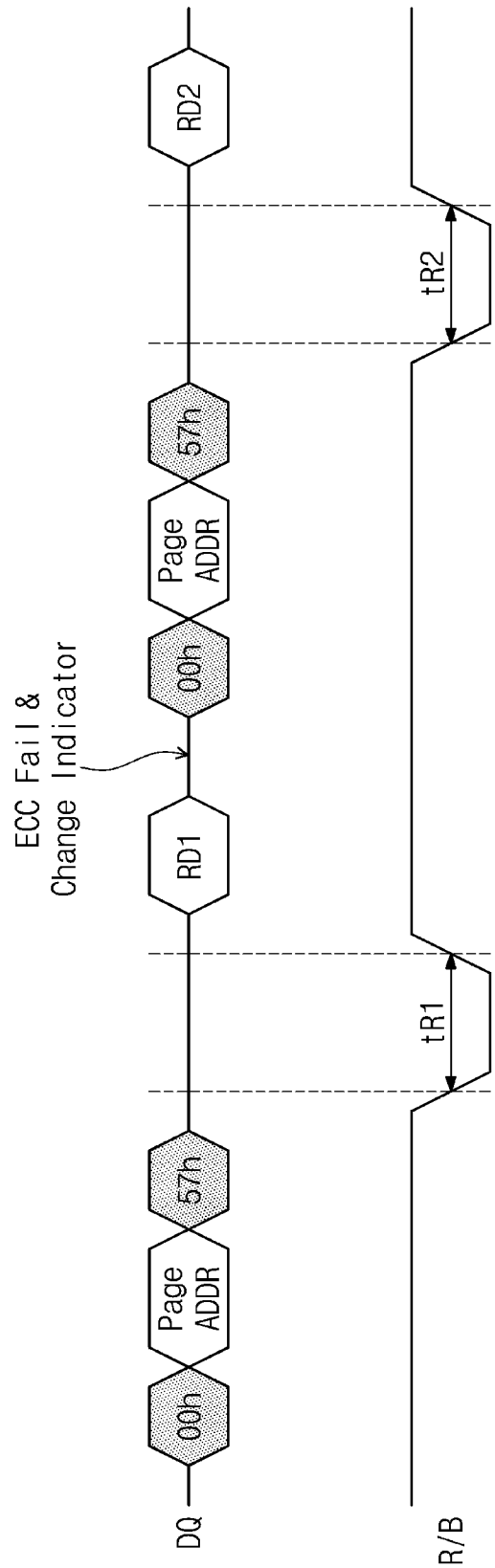
FIG. 13 is a timing diagram illustrating signals input to a nonvolatile memory device and signals output from the nonvolatile memory device, according to an embodiment of the present disclosure.

FIG. 12 is a flowchart illustrating a method of accessing a physical area in which firmware is stored, without a block address, according to an embodiment of the present disclosure. FIG. 13 is a timing diagram illustrating signals input to a nonvolatile memory device to which an addressing rule is applied and signals output from the nonvolatile memory device, according to an aspect of the present disclosure. For better understanding, a description of FIG. 12 and FIG. 13 will be given together with reference to aspects of FIGS. 3 and 11.

In operation S310, the storage device 300 may be booted on. However, since the addressing rule of the present disclosure is applied even during a runtime of the storage device 300, operation S310 may be omitted.

In operation S320, the first memory block BLK1 where the firmware FW is stored may be accessed by using the direct access command DA CMD, a page address, and an indicator stored in the reference memory block BLK0. For example, the direct access command DA CMD may be any one of at least two commands, i.e., the first command 00h and the second command 57h included in a command sequence.

In response to the direct access command DA CMD, if the first memory block BLK1 is indicated by an indicator, the controller 310 may access the first memory block BLK1 without a block address. In addition, the controller 310 may access a physical area of the first memory block BLK1 in which firmware is stored, by using the page address. A read operation may be performed on the first memory block BLK1 during a first read period tR, and the firmware FW may be loaded onto the buffer memory 330 (S330). The firmware FW read from the first memory block BLK1 is marked as the first read data RD1.

In operation S340, error check and correction may be performed. For example, if an error is absent from the loaded firmware FW or if a detected error of the loaded firmware FW is corrected (S340=No), the procedure may terminate. That is, the loaded firmware FW may be used to operate/drive the storage device 300. In contrast, if the detected error of the loaded firmware FW is uncorrectable (S340=Yes), operation S350 may be performed.

In operation S350, the nonvolatile memory device 320 may change an indicator in response to the vendor-specific command. For example, the indicator may be changed to indicate the second memory block BLK2 instead of the first memory block BLK1.

In operation S360, the second memory block BLK2 where the firmware FW is stored may be accessed by using the page address and the changed indicator. Unlike the case where the first memory block BLK1 is indicated by an indicator in operation S320, since the indicator is changed, the second memory block BLK2 may be indicated in response to the direct access command DA CMD. Accordingly, the controller 310 may access the second memory block BLK2 without a block address.

In operation S370, a read operation may be performed on the second memory block BLK2 during a second read period tR, and the firmware FW may be loaded onto the buffer memory 330. The firmware FW read from the second memory block BLK2 is marked as the second read data RD2. However, the firmware FW loaded from the first memory block BLK1 and the firmware FW loaded from the second memory block BLK2 may be the same as each other except that the pieces of firmware FW are read from the different memory blocks BLK1 and BLK2.

Figure 14:
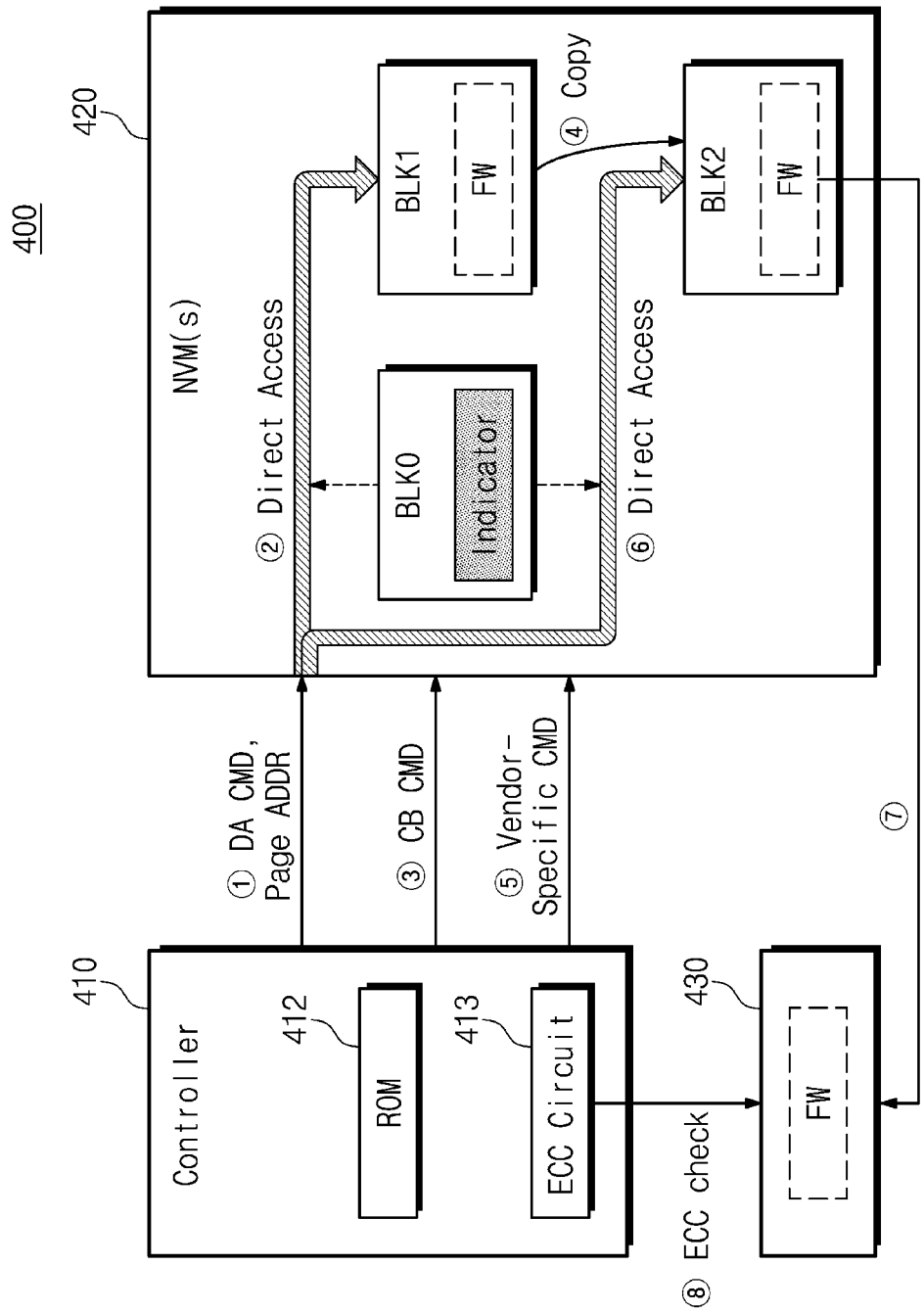
FIG. 14 is a block diagram for conceptually illustrating an addressing rule, according to an embodiment of the present disclosure.

FIG. 14 is a block diagram for conceptually illustrating an addressing rule, according to an embodiment of the present disclosure. In addition to the above-described exemplary embodiments, teachings of the present disclosure may be applied to various command sequences for executing a read operation by the page. For example, there may occur the event that there is a need to copy firmware to another memory block due to, for example, an increase in a wearing level of a memory block where the firmware is stored. That is, an embodiment of FIG. 14 shows that the addressing rule of the present disclosure is applicable to a copyback operation.

Referring to FIG. 14, the direct access command DA CMD and a page address may be transmitted to a nonvolatile memory device 420. In response to the direct access command DA CMD, an indicator stored in the reference memory block BLK0 may indicate the first memory block BLK1 (operation ①). A controller 410 may access the first memory block BLK1 where firmware is stored, without a block address (operation ②).

For example, the controller 410 may determine that there is a need to copy firmware to the second memory block BLK2 due to an increase in a wearing level of the first memory block BLK1 that stores the firmware FW to be loaded. The determination may be made, for example, by driving separate firmware for managing wear leveling. In response to a copy command CB CMD received from the controller 410 (operation ③), the nonvolatile memory device 420 may copy the firmware FW stored in the first memory block BLK1 to the second memory block BLK2 (operation ④). In other words, the firmware FW may be considered first data, and may be copied to the second memory block BLK2 in response to a copy command received from the controller 410 (i.e., copied in response to a copy command received from the outside of the nonvolatile memory device 420).

However, since a firmware-stored area accessible without a block address is changed, there is a need to change an indicator. Accordingly, if the copy operation is completed, the controller 410 may transmit the vendor-specific command to the nonvolatile memory device 420 (⑤). In response to the vendor-specific command, the nonvolatile memory device 420 may change an indicator that the indicator indicates the second memory block BLK2. Accordingly, the controller 410 may access the second memory block BLK2 indicated by the indicator without a block address (operation ⑥).

Firmware may be loaded onto a buffer memory 430 as the result of accessing the second memory block BLK2 where the copied firmware FW is stored (operation ⑦), and an ECC circuit 413 may perform an error check and correction operation.

Figure 15:
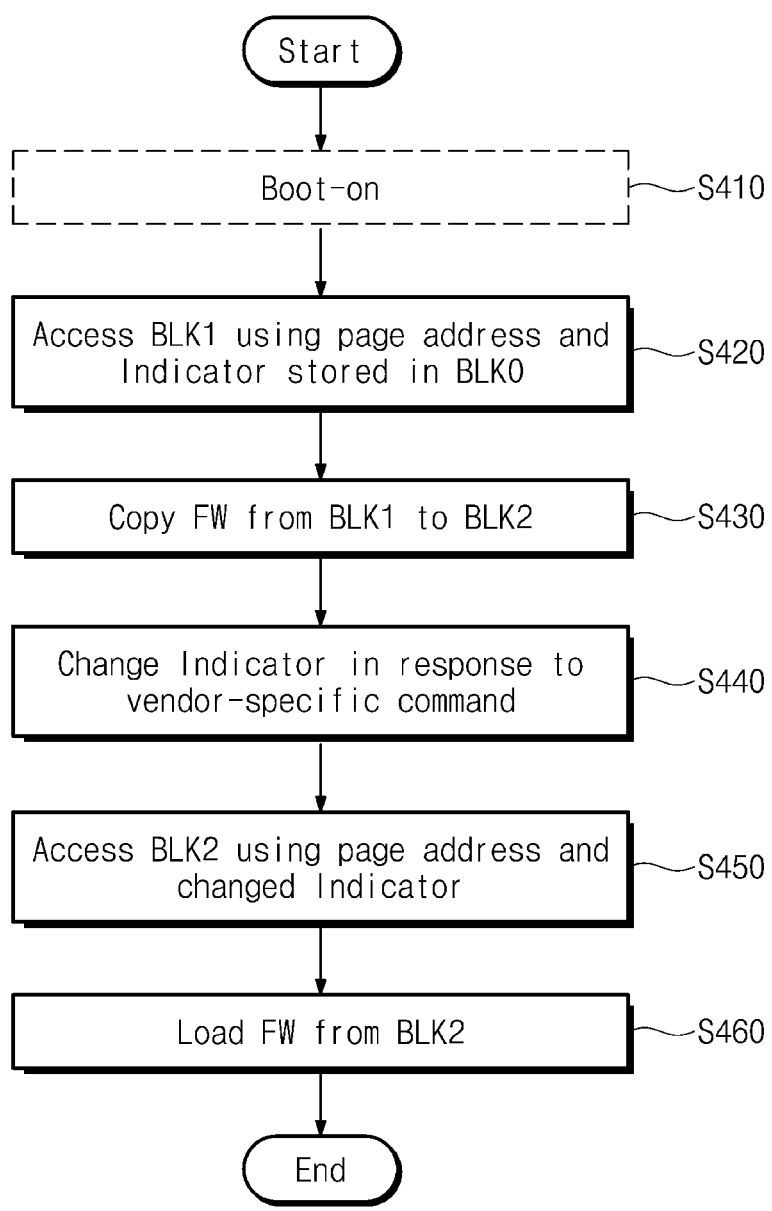
FIG. 15 is a flowchart illustrating a method of accessing a physical area in which firmware is stored, without a block address, according to an embodiment of the present disclosure.
Figure 16:
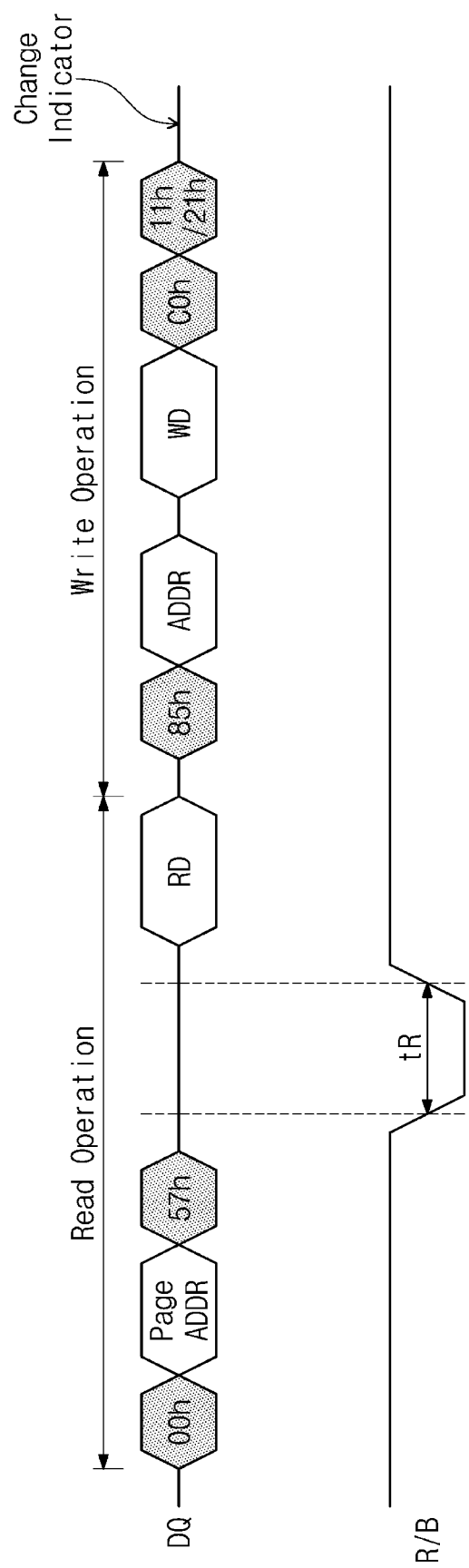
FIG. 16 is a timing diagram illustrating signals input to a nonvolatile memory device and signals output from the nonvolatile memory device, according to an embodiment of the present disclosure.

FIG. 15 is a flowchart illustrating a method of accessing a physical area in which firmware is stored, without a block address, according to an embodiment of the present disclosure. FIG. 16 is a timing diagram illustrating signals input to a nonvolatile memory device to which an addressing rule is applied and signals output from the nonvolatile memory device, according to an aspect of the present disclosure. For better understanding, a description of FIG. 15 and FIG. 16 will be given together with reference to aspects of FIGS. 3 and 14.

In operation S410, a storage device 400 may be booted on. However, since the addressing rule of the present disclosure is applied even during a runtime of the storage device 400, operation S410 may be omitted.

In operation S420, the first memory block BLK1 where the firmware FW is stored may be accessed by using the direct access command DA CMD, a page address, and an indicator stored in the reference memory block BLK0. For example, the direct access command DA CMD may be any one of at least two commands, i.e., the first command 00h and the second command 57h included in a command sequence. As such, a read operation may be performed on the first memory block BLK1 during a read period tR.

However, unlike the above embodiments, the read firmware FW may not be loaded onto a buffer memory 430. Instead, the read firmware FW may be stored in a page buffer (123 of FIG. 3) for copyback. The firmware FW read from the first memory block BLK1 is marked as read data RD.

In operation S430, in response to a copy command CMD, the firmware FW stored in the first memory block BLK1 may be copied to the second memory block BLK2. For example, the copy command CMD may be a command 85h indicating a start of a write operation. The controller 410 may transmit an address ADDR of a physical area where the read data RD stored in the page buffer 123 will be stored, to the nonvolatile memory device 420. Here, the address ADDR may include both a page address and a block address of the second memory block BLK2 to which the read data RD will be copied. The read data RD stored in the page buffer 123 may be stored in the second memory block BLK2 in the form of write data WD.

In operation S440, the nonvolatile memory device 420 may change an indicator in response to a vendor-specific command. For example, the indicator may be changed to indicate the second memory block BLK2 instead of the first memory block BLK1.

In operation S450, the second memory block BLK2 where the firmware FW is stored may be accessed by using the page address and the changed indicator. Afterwards, the firmware FW may be loaded from the second memory block BLK2 (S460), and an ECC circuit 413 may detect and correct an error of the loaded firmware FW.

Various examples to which the inventive concepts described herein are applied are described above, but the present disclosure is not limited thereto. For example, the teachings of the present disclosure may be applied to the case where a command sequence (e.g., including 00h and 30h) for reading data by the page is transmitted to a nonvolatile memory device. As described in the embodiments of the present disclosure, a memory block which stores data to be loaded (e.g., BLK1) is indicated by an indicator stored in the reference memory block BLK0. Accordingly, it is possible to access the memory block which stores the data to be loaded (e.g., BLK1) without an address of the memory block which stores the data to be loaded (e.g., BLK1). Accordingly, a problem associated with an addressing rule in the case where nonvolatile memory devices are manufactured by different memory vendors may be solved.

Figure 17:
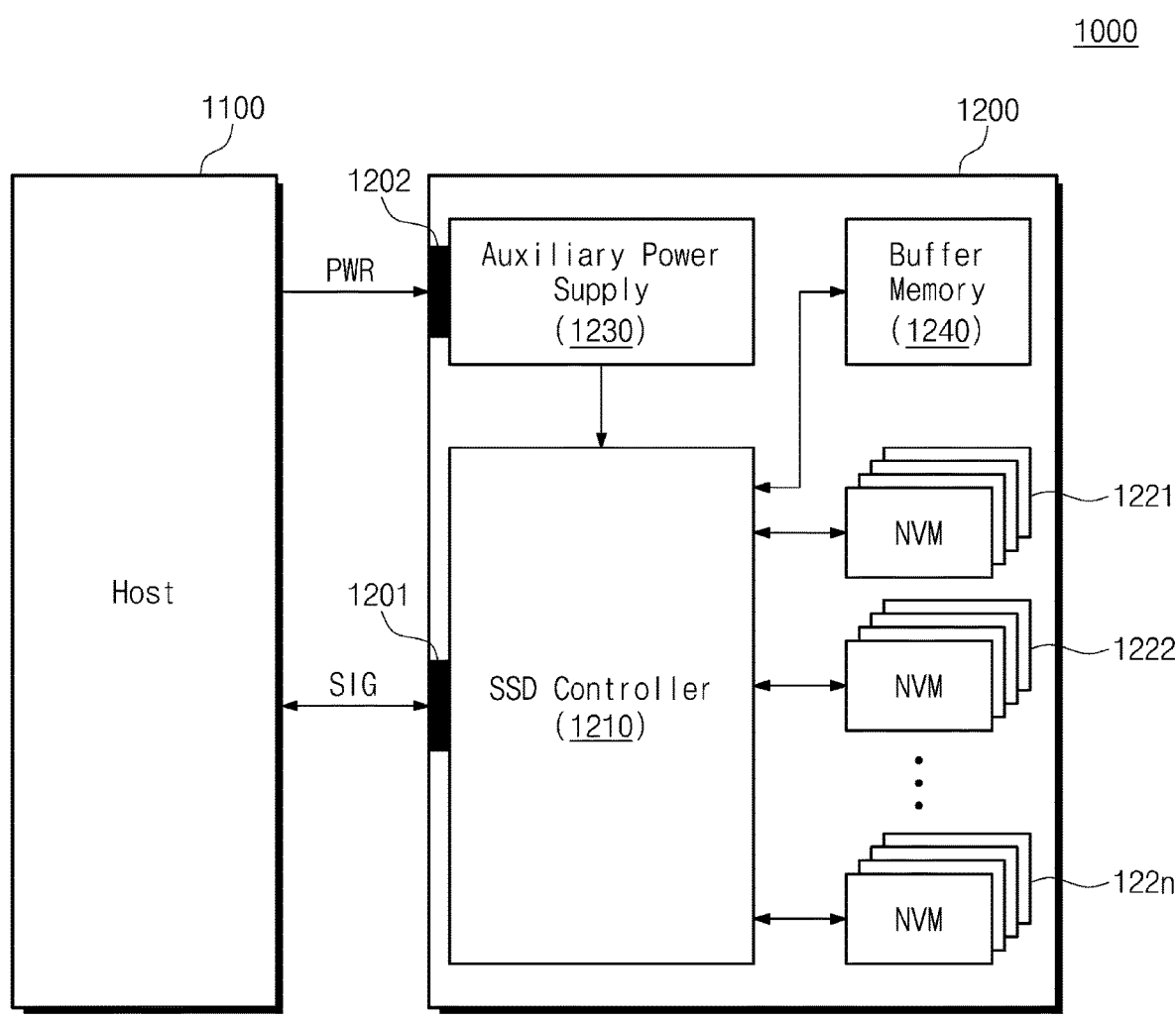
FIG. 17 is a block diagram illustrating a solid-state drive (SSD) to which a nonvolatile memory device according to the present disclosure is applied.

FIG. 17 is a block diagram illustrating a solid-state drive system 1000 (SSD system) to which a nonvolatile memory device according to the teachings of the present disclosure are applied. Referring to FIG. 17, the solid-state drive system 1000 may include a host 1100 and an SSD 1200.

The SSD 1200 may exchange signals SIG with the host 1100 through a signal connector 1201 and may be supplied with power PWR through a power connector 1202. The SSD 1200 may include an SSD controller 1210, multiple flash memories 1221 to 122n, an auxiliary power supply 1230, and a buffer memory 1240.

The SSD controller 1210 may control the flash memories 1221 to 122n in response to the signal SIG from the host 1100. In an embodiment, the SSD controller 1210 may access the flash memories 1221 to 122n by using only a direct access command and a page address, based on the operating methods described with reference to FIGS. 1 to 17.

The flash memories 1221 to 122n may operate under control of the SSD controller 1210. The auxiliary power supply 1230 may be connected with the host 1100 through the power connector 1002. The auxiliary power supply 1230 may be charged by the power PWR from the host 1100. When the power PWR is not smoothly supplied from the host 1100, the auxiliary power supply 1230 may power the SSD 1200.

According to an embodiment of the present disclosure, a memory device may be improved by being made accessible without a block address. Accordingly, a problem that occurs due to different addressing rules of memory vendors upon loading firmware from the memory device may be solved.

In addition, since the addressing rule is simplified, the performance of a nonvolatile memory device may be improved.

While the teachings of the inventive concepts described herein make reference to exemplary embodiments, it will be apparent to those of ordinary skill in the art that various changes and modifications may be made thereto without departing from the spirit and scope of the present disclosure as set forth in the following claims.

What is claimed is:

1. A nonvolatile memory device which includes a plurality of memory blocks, comprising:
   a first memory block which includes a first physical area in which first data are stored; and
   a reference memory block which stores an indicator, the indicator indicating the first memory block as an indication in response to a first direct access command received from the outside,
   wherein the first physical area, in which the first data are stored, of the first memory block is accessed according to the indication of the indicator and a page address received from the outside together with the first direct access command.

2. The nonvolatile memory device of claim 1, further comprising:
   a second memory block which includes a second physical area that stores second data which is same as the first data,
   wherein the indicator indicates the second memory block as the indication in response to a second direct access command received from the outside, and
   wherein the second physical area, in which the second data are stored, of the second memory block is accessed according to the page address and the indication of the indicator.

3. The nonvolatile memory device of claim 2, wherein the second data are read from the second memory block if an error of the first data read from the first memory block is uncorrectable.

4. The nonvolatile memory device of claim 2, wherein the first physical area and the second physical area have the same page address.

5. The nonvolatile memory device of claim 2, wherein the first data and the second data are firmware for driving or managing the nonvolatile memory device.

6. The nonvolatile memory device of claim 1, further comprising:
   a second memory block that stores second data which is same as the first data,
   wherein the indicator is changed in response to a vendor-specific command received from the outside, so as to indicate the second memory block when the first direct access command is received.

7. The nonvolatile memory device of claim 6, wherein the second data are read from the second memory block if an error of the first data read from the first memory block is uncorrectable.

8. The nonvolatile memory device of claim 6, wherein the change to the second memory block is made at booting-on of the nonvolatile memory device or during a runtime of the nonvolatile memory device.

9. The nonvolatile memory device of claim 1, further comprising:
   a second memory block to which the first data are copied in response to a copy command received from the outside.

10. The nonvolatile memory device of claim 9, wherein the indicator is changed in response to a vendor-specific command received from the outside, so as to indicate the second memory block when the first direct access command is received.

11. The nonvolatile memory device of claim 1, wherein the first direct access command is any one of a plurality of commands included in a command sequence for reading the first read data.

12. The nonvolatile memory device of claim 1, wherein the nonvolatile memory device includes:
   a memory cell array including the first memory block and the reference memory block and including a plurality of memory cells that are formed to be perpendicular to a substrate and are connected to a plurality of word lines and a plurality of bit lines; and
   a page buffer configured to store data read from the memory cell array,
   wherein a plurality of cell strings, each of which includes serially connected memory cells among the plurality of memory cells, are connected in common to a bit line.

13. A storage device, comprising:
   a controller configured to generate a first direct access command and a page address; and
   a nonvolatile memory device including a first memory block in which first data are stored in a first physical area, and a reference memory block which stores an indicator, the indicator indicating the first memory block as an indication in response to the first direct access command being received from the controller,
   wherein the controller is configured to access the first physical area, in which the first data are stored, of the first memory block according to the page address and the indication of the indicator.

14. The storage device of claim 13, wherein the nonvolatile memory device further includes:
   a second memory block which includes a second physical area that stores second data which is same as the first data, and
   wherein the controller is configured to access the second physical area, in which the second data are stored, of the second memory block according to the page address and the indication of the indicator.

15. The storage device of claim 13, wherein the nonvolatile memory device further includes:
   a second memory block that stores second data which is same as the first data,
   wherein the controller is further configured to generate a vendor-specific command, and
   wherein the indicator is changed in response to the vendor-specific command so as to indicate the second memory block when the first direct access command is received.

16. The storage device of claim 13, wherein the controller is further configured to generate a copy command, and
   wherein the nonvolatile memory device further includes a second memory block to which the first data are copied in response to the copy command.

17. The storage device of claim 16, wherein the controller is further configured to generate a vendor-specific command, and
   wherein the indicator is changed in response to the vendor-specific command so as to indicate the second memory block when the first direct access command is received.

18. The storage device of claim 13, wherein the nonvolatile memory device includes:
   a memory cell array including the first memory block and the reference memory block and including a plurality of memory cells that are formed to be perpendicular to a substrate and are connected to a plurality of word lines and a plurality of bit lines; and
   a page buffer configured to store data read from the memory cell array, and wherein a plurality of cell strings, each of which comprises serially connected memory cells among the plurality of memory cells, are connected in common to a bit line.

19. A method of operating a nonvolatile memory device which includes a plurality of memory blocks and is controlled by a controller, the method comprising:

receiving, by the nonvolatile memory device, a first direct access command and a page address from the controller;

indicating, by an indicator stored in a reference memory block among the plurality of memory blocks, a first memory block as an indication in response to the first direct access command received from the controller; and accessing a first physical area, in which first data to read are stored, of the first memory block according to the page address and the indication of the indicator of the first memory block, to obtain a result of accessing the first physical area.

20. The method of claim 19, further comprising:

if an error of the first data loaded as the result of accessing the first physical area is uncorrectable, receiving a second direct access command from the controller;

indicating, by the indicator, a second memory block as the indication in response to the second direct access command; and accessing a second physical area, in which second data to read are stored, of the second memory block according to the page address and the indication of the indicator of the second memory block.

* * * * *